United States Patent
Chou et al.

(10) Patent No.: US 11,373,947 B2
(45) Date of Patent: Jun. 28, 2022

(54) METHODS OF FORMING INTERCONNECT STRUCTURES OF SEMICONDUCTOR DEVICE

(71) Applicant: Taiwan Semiconductor Manufacturing Co., Ltd., Hsinchu (TW)

(72) Inventors: Chia-Cheng Chou, Keelung (TW); Chung-Chi Ko, Nantou (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/801,166

(22) Filed: Feb. 26, 2020

(65) Prior Publication Data
US 2021/0265264 A1 Aug. 26, 2021

(51) Int. Cl.
*H01L 23/522* (2006.01)
*H01L 23/528* (2006.01)
*H01L 21/768* (2006.01)

(52) U.S. Cl.
CPC .... *H01L 23/5226* (2013.01); *H01L 21/76807* (2013.01); *H01L 23/528* (2013.01); *C04B 2235/61* (2013.01); *G01V 2210/6242* (2013.01)

(58) Field of Classification Search
CPC .............. H01L 23/5226; H01L 23/528; H01L 21/76807; G01V 2210/6242; C04B 2235/61
See application file for complete search history.

(56) References Cited

U.S. PATENT DOCUMENTS

| | | | |
|---|---|---|---|
| 6,391,795 B1 * | 5/2002 | Catabay | H01L 21/02274 438/763 |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2002/0063338 A1 * | 5/2002 | Mikami | H01L 23/5222 257/762 |
| 2004/0021224 A1 * | 2/2004 | Fukuyama | H01L 23/3192 257/758 |
| 2009/0121359 A1 * | 5/2009 | Nomura | H01L 21/76822 257/758 |
| 2015/0276663 A1 * | 10/2015 | Takechi | H01L 29/7869 257/253 |
| 2016/0379871 A1 * | 12/2016 | Tsai | H01L 21/76802 257/774 |
| 2017/0110397 A1 * | 4/2017 | Wu | H01L 21/02126 |
| 2017/0256445 A1 * | 9/2017 | Chou | H01L 29/7851 |

(Continued)

*Primary Examiner* — Galina G Yushina
(74) *Attorney, Agent, or Firm* — JCIPRNET

(57) ABSTRACT

An interconnect structure includes an interconnect structure includes an etching stop layer; a dielectric layer and an insert layer on the etching stop layer, and a conductive feature in the dielectric layer, the insert layer and the etching stop layer. A material of the insert layer is different from the dielectric layer and the etching stop layer.

20 Claims, 32 Drawing Sheets

(56) References Cited

U.S. PATENT DOCUMENTS

| | | | |
|---|---|---|---|
| 2018/0037023 A1* | 2/2018 | Kusunoki | B41J 2/04581 |
| 2018/0226289 A1* | 8/2018 | Bielefeld | H01L 21/76834 |
| 2020/0144103 A1* | 5/2020 | Kim | H01L 21/76829 |
| 2020/0312956 A1* | 10/2020 | Yeh | H01L 29/66545 |

* cited by examiner

METHODS OF FORMING INTERCONNECT STRUCTURES OF SEMICONDUCTOR DEVICE

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, copper-based interconnect structures typically implemented in multilayer interconnect (MLI) features have presented performance, yield, and cost challenges as MLI features become more compact with ever-shrinking IC feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
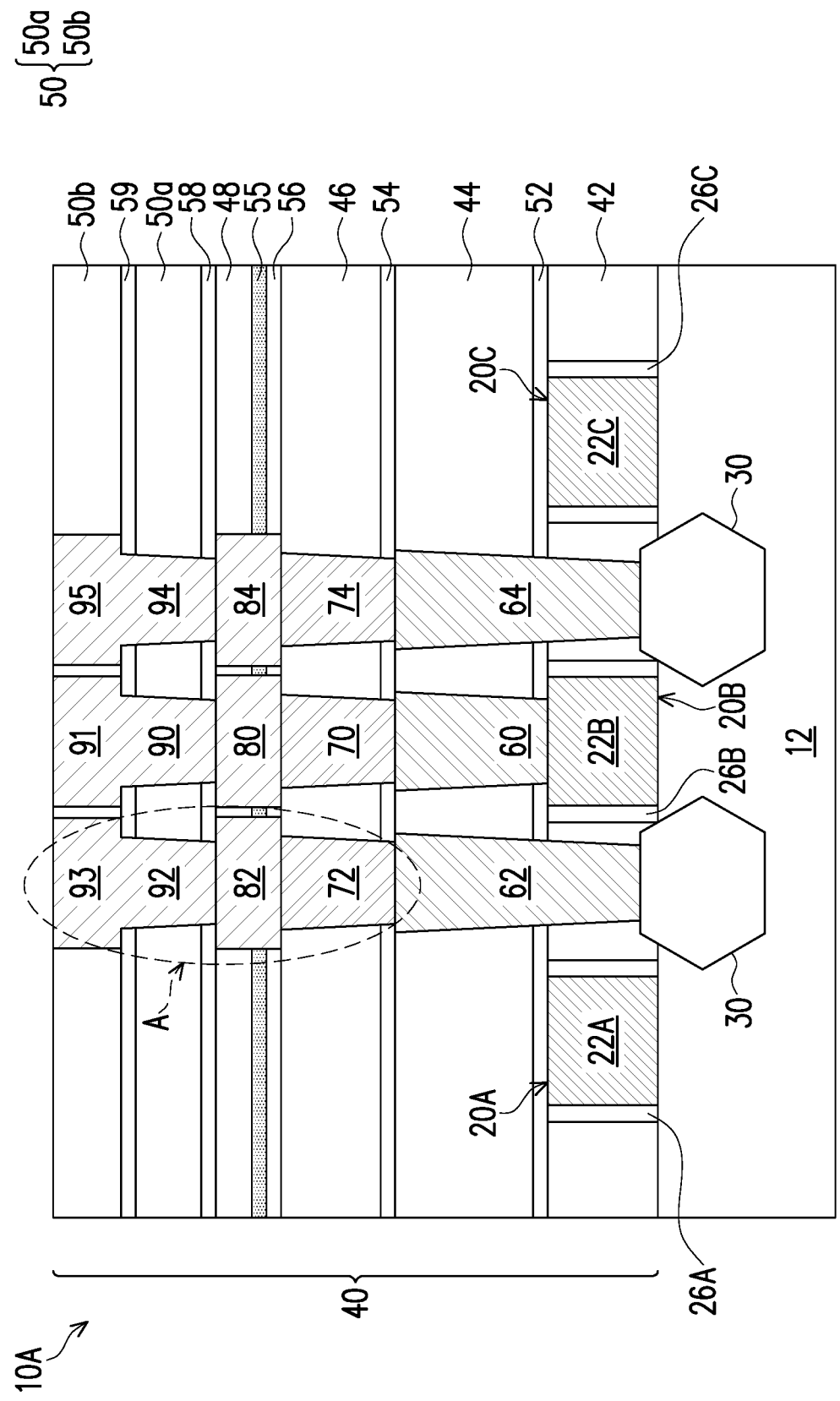
FIGS. 1A-1F are fragmentary diagrammatic views of integrated circuit devices, in portion or entirety, according to various embodiments of the present disclosure.

The present disclosure relates generally to integrated circuit devices, and more particularly, to interconnect structures for integrated circuit devices.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes may include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. For example, BEOL processes may include forming multilayer interconnect features that facilitate operation of the IC devices. However, this BEOL processes have been observed to exhibit higher aspect ratios, resistivity, and line-to-line capacitance; cause damages in surrounding ILD layer(s); and develop voids, collapse, and/or bend during patterning and deposition processes. Accordingly, although existing interconnect structures have been generally adequate for their intended purposes, they have not been entirely satisfactory in all respects. The present disclosure explores methods of forming interconnect structures during BEOL processes for improved IC device performance.

FIG. 1A is a fragmentary diagrammatic view of an integrated circuit device 10A, in portion or entirety, according to various embodiment of the present disclosure. Integrated circuit device 10 may be included in a microprocessor, a memory, and/or other integrated circuit device. In some implementations, integrated circuit device 10A is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1A has been simplified for the sake of clarity to better understand the inventive concepts of the present disclosure. Additional features may be added in integrated circuit device 10A, and some of the features described below may be replaced, modified, or eliminated in other embodiments of integrated circuit device 10A.

Integrated circuit device 10A includes a substrate (e.g., a wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods. Substrate 12 may include various doped regions (not shown) depending on design requirements of integrated circuit device 10A. In some implementations, substrate 12 includes p-type doped regions (for example, p-type wells) doped with p-type dopants, such as boron (for example, $BF_2$), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions may be formed directly on and/or in substrate 12, for example, providing a p-well structure, an n-well structure, a dual-well structure, a raised structure, or combinations thereof. An ion implantation process, a diffusion process, other suitable doping process, or combinations thereof may be performed to form the various doped regions.

An isolation feature(s) (not shown) is formed over and/or in substrate 12 to isolate various regions, such as various device regions, of integrated circuit device 10A. For example, isolation features define and electrically isolate active device regions and/or passive device regions from each other. Isolation features include silicon oxide, silicon nitride, silicon oxynitride, other suitable isolation material, or combinations thereof. Isolation features may include different structures, such as shallow trench isolation (STI) structures, deep trench isolation (DTI) structures, and/or local oxidation of silicon (LOCOS) structures. In some implementations, isolation features include STI features. For example, STI features may be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current may flow between the source/drain regions during operation. In some implementations, gate structures 20A-20C are formed over a fin structure, such that gate structures 20A-20C each wrap a portion of the fin structure. For example, one or more of gate structures 20A-20C wrap channel regions of the fin structure, thereby interposing a source region and a drain region of the fin structure.

Gate structures 20A-20C include metal gate (MG) stacks, such as a metal gate stack 22A, a metal gate stack 22B, and a metal gate stack 22C. Metal gate stacks 22A-22C are configured to achieve desired functionality according to design requirements of integrated circuit device 10A, such that metal gate stacks 22A-22C include the same or different layers and/or materials. In some implementations, metal gate stacks 22A-22C include a gate dielectric (for example, a gate dielectric layer; not shown) and a gate electrode (for example, a work function layer and a conductive bulk layer; not shown). Metal gate stacks 22A-22C may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfSiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), manganese (Mn), zirconium (Zr), TaAl, TaAlC, TiAlN, TaC, TaCN, TaSiN, other suitable n-type work function materials, or combinations thereof. In some implementations, the work function layer includes a p-type work function material, such as Mo, Al, ruthenium (Ru), TiN, TaN, WN, $ZrSi_2$, $MoSi_2$, $TaSi_2$, $NiSi_2$, WN, other suitable p-type work function materials, or combinations thereof. The bulk (or fill) conductive layer includes a suitable conductive material, such as Al, W, and/or Cu. The conductive bulk layer may additionally or collectively include polysilicon, Ti, Ta, metal alloys, other suitable materials, or combinations thereof.

Gate structures 20A-20C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 22A-22C are fabricated according to a gate-last process, a gate-first process, or a hybrid gate-last/gate-first process. In gate-last process implementations, gate structures 20A-20C include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer containing silicon and nitrogen, such as a silicon nitride layer, may be deposited over substrate 12 and subsequently etched by anisotropic etching to form spacers 26A-26C. In some implementations, spacers 26A-26C include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to metal gate stacks 22A-22C. In such implementations, the various sets of spacers may include materials having different etch rates. For example, a first dielectric layer containing silicon and oxygen (for example, silicon oxide) may be deposited over substrate 12 and subsequently etched by anisotropic etching to form a first spacer set adjacent to metal gate stacks 22A-22C (or dummy metal gate stacks, in some implementations), and a second dielectric layer including silicon and nitrogen (for example, silicon nitride) may be deposited over substrate 12 and subsequently etched by anisotropic etching to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming spacers 26A-26C, depending on design requirements of integrated circuit device 10A.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such a pull-up transistor or a pull-down transistor, of integrated circuit device 10A. Gate structure 20B and/or epitaxial source/drain features 30 are thus alternatively referred to as device features. In some implementations, epitaxial source/drain features 30 wrap source/drain regions of a fin structure. An epitaxy process may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process may use gaseous and/or liquid precursors, which interact with the composition of substrate 12. Epitaxial source/drain features 30 are doped with n-type dopants and/or p-type dopants. In some implementations, where integrated circuit device 10A is configured as an n-type device (for example, having an n-channel), epitaxial source/drain features 30 are epitaxial layers containing silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In some implementations, where integrated circuit device 10A is configured as a p-type device (for example, having a p-channel), epitaxial source/drain features 30 are epitaxial layers containing silicon and germanium, where the silicon germanium containing epitaxial layers are doped with boron, other p-type dopant, or combinations thereof (for example, forming a Si:Ge:B epitaxial layer). In some implementations, epitaxial source/drain features 30 include materials and/or dopants that achieve desired tensile stress and/or compressive stress in the channel region. In some implementations, epitaxial source/drain features 30 are doped during deposition by adding impurities to a source material of the epitaxy process. In some implementations, epitaxial source/drain features 30 are doped by an ion implantation process subsequent to a deposition process. In some implementations, annealing processes are performed to activate dopants in epitaxial source/drain features 30 and/or other source/drain regions of integrated circuit device 10A (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of integrated circuit device 10A, such that the various devices and/or components may operate as specified by design requirements of integrated circuit device 10A. MLI feature 40 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 40. During operation of integrated circuit device 10A, the interconnect structures are configured to route signals between the devices and/or the components of integrated circuit device 10A and/or distribute signals (for example, clock signals, voltage signals, and/or ground signals) to the devices and/or the components of integrated circuit device 10A. It is noted that though MLI feature 40 is depicted with a given number of dielectric layers and conductive layers, the present disclosure contemplates MLI feature 40 having more or less dielectric layers and/or conductive layers depending on design requirements of integrated circuit device 10A.

In FIG. 1A, MLI feature 40 includes one or more dielectric layers, such as an interlayer dielectric (ILD) layer 42 disposed over substrate 12, an interlayer dielectric layer 44 disposed over ILD layer 42, an interlayer dielectric layer 46 disposed over ILD layer 44, an intermetal dielectric layer 48 (IMD) disposed over ILD layer 46 and an intermetal dielectric layer 50 disposed over dielectric layer 48. ILD layers 42-46 and IMD layers 48-50 include a dielectric material including, for example, silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Low-k dielectric materials include, for example, FSG, carbon doped silicon oxide, Black Diamond® (Applied Materials of Santa Clara, Calif.), Xerogel, Aerogel, amorphous fluorinated carbon, Parylene, BCB, SiLK (Dow Chemical, Midland, Mich.), polyimide, other low-k dielectric material, or combinations thereof. In the depicted embodiment, ILD layers 42-46 and IMD layers 48-50 are dielectric layers that include a low-k dielectric material (generally referred to as low-k dielectric layers). ILD layers 42-46 and IMD layers 48-50 may include a multilayer structure having multiple dielectric materials. MLI feature 40 may further include one or more contact etch stop layers (CESL) disposed over substrate 12, such as a CESL 52 disposed between ILD layer 42 and ILD layer 44, a CESL 54 disposed between ILD layer 44 and ILD layer 46, a CESL 56 disposed between ILD layer 46 and IMD layer 48, CESL 58 disposed between IMD layer 48 and IMD layer 50, and CESL 59 disposed between a first portion 50a and a second portion 50b of IMD layer 50. In some implementations, a CESL (not shown) is also disposed between substrate 12 and ILD layer 42. In some implementations, CESLs 52-59 include a material different than ILD layers 42-46 and IMD layers 48-50, such as a dielectric material that is different than the dielectric material of ILD layers 42-46 and IMD layers 48-50. In the depicted embodiment, ILD layers 42-46 and IMD layers 48-50 include a low-k dielectric material, and CESLs 52-59 include aluminum oxide. ILD layers 42-46 and IMD layers 48-50 and/or CESLs 52-59 are formed over substrate 12, for example, by a deposition process, such as CVD, PVD, ALD, PECVD, HDPCVD, MOCVD, RPCVD, LPCVD, ALCVD, APCVD, spin-on dielectric, plating, other suitable methods, or combinations thereof. In some implementations, ILD layers 42-46 and IMD layers 48-50 and/or CESLs 52-59 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-46 and IMD layers 48-50 and/or CESLs 52-59, a CMP process and/or other planarization process is performed, such that ILD layers 42-46 and IMD layers 48-50 and/or CESLs 52-59 have substantially planar surfaces.

A device-level contact 60, a device-level contact 62, a device-level contact 64, a via 70, a via 72, a via 74, a conductive line 80, a conductive line 82, a conductive line 84, a via 90, a via 92, a via 94, a conductive line 91, a conductive line 93, and a conductive line 95 are disposed in ILD layers 42-46 and IMD layers 48-50 to form interconnect structures. Device-level contacts 60-64 (also referred to as local interconnects or local contacts) electrically couple and/or physically couple IC device features to other conductive features of MLI feature 40. For example, device-level contact 60 is a metal-to-poly (MP) contact, which generally refers to a contact to a gate structure, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and CESL 52, though the present disclosure contemplates embodiments where device-level contact 60 extends through more than one ILD layer and/or CESL of MLI feature 40. In furtherance of the example, device-level contact 62 and device-level contact 64 are metal-to-device (MD) contacts, which generally refer to contacts to a conductive region of integrated circuit device 10A, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 44, CESL 52, and ILD layer 44, though the present disclosure contemplates embodiments where device-level contact 62 and/or device-level contact 64 extend through more than one ILD layer and/or CESL of MLI feature 40. In some implementations, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 and vias 90-94 electrically couple and/or physically couple conductive features (for example, conductive lines 80-84) of MLI feature 40 to one another (for example, conductive lines 91-95). For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. Additionally, vias 90-94 are disposed on conductive lines 80,82, and 84, respectively, such that vias 90-94 connect conductive lines 80,82, and 84 to conductive lines 91,93, and 95 of the MLI feature 40, respectively. In the depicted embodiment, vias 70-74 extend through ILD layer 46 and CESL 54 to contact device-level contacts 60-64, conductive lines 80-84 extend through IMD layer 48 and CESLs 56 to contact vias 70-74, and vias 90-94 extend through IMD layer 50 and CESLs 58-59 to contact conductive lines 80-84, though the present disclosure contemplates embodiments where vias 70-74, conductive lines 80-84, and vias 90-94 extend through more than one dielectric layer and/or CESL of MLI feature 40. In some implementations, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. In some implementations, vias 90,92 and 94 are BEOL conductive features that interconnect BEOL conductive features (for example, conductive lines 80-84) to another BEOL conductive features, thereby electrically and/or physically coupling another BEOL conductive features of integrated circuit device 10A. Device-level contacts 60-64, vias 70-74, conductive lines 80-84, vias 90-94, and conductive lines 91-95 include any suitable conductive material, such as Co, Ru, Cu, Ta, Ti, Al, TaN, TiN, other suitable conductive materials, or combinations thereof.

One process implemented to form conductive lines 80-84 disposed over vias 70-74 include depositing CESL 56 and IMD layer 48 over ILD layer 46); performing one or more lithography and/or etching processes to provide openings for the conductive lines 80-84 in IMD layer 48; filling the openings by a deposition process to form the conductive lines 80-84; and subsequently performing one or more CMP processes to remove any excess conductive material(s). As IC technologies progress towards smaller technology nodes (such as 16 nm, 10 nm, 7 nm, 5 nm, and below) and MLI features become more compact, interconnect features formed have been observed to exhibit higher aspect ratios, resistivity, and line-to-line capacitance; cause damages in surrounding IMD layer(s); and collapse, and/or bend during patterning and deposition processes.

Figure 1B:
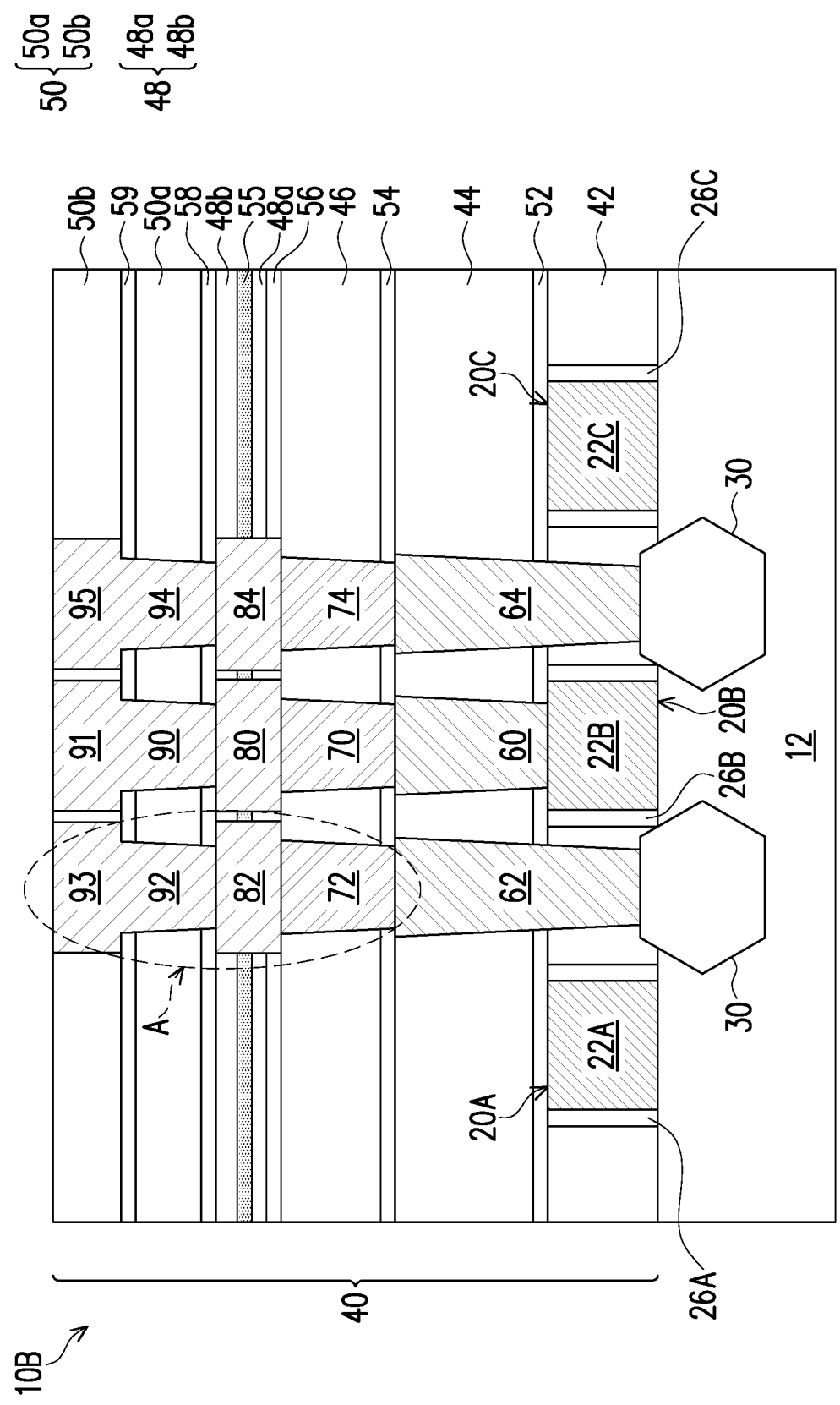
Figure 1C:
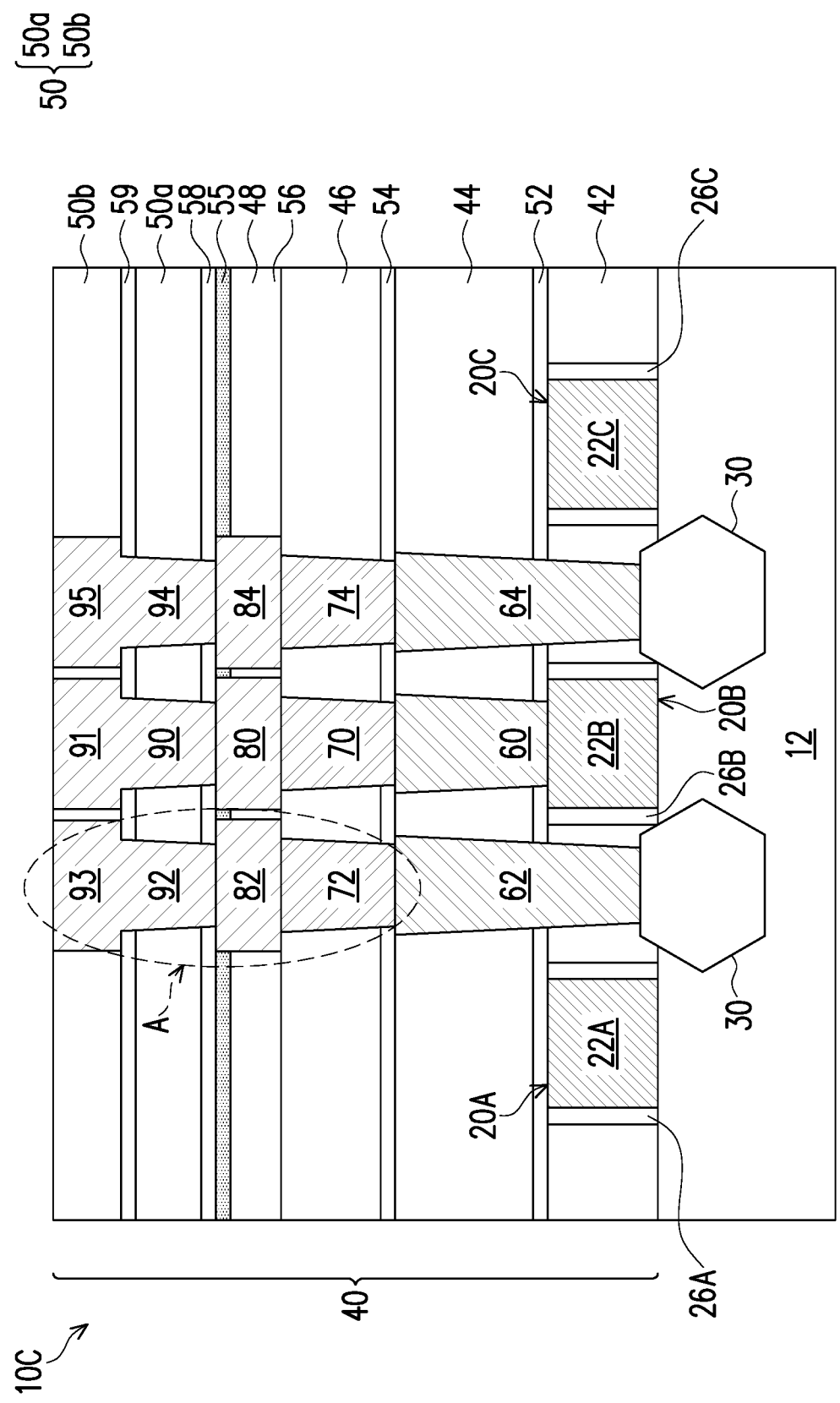
Figure 1D:
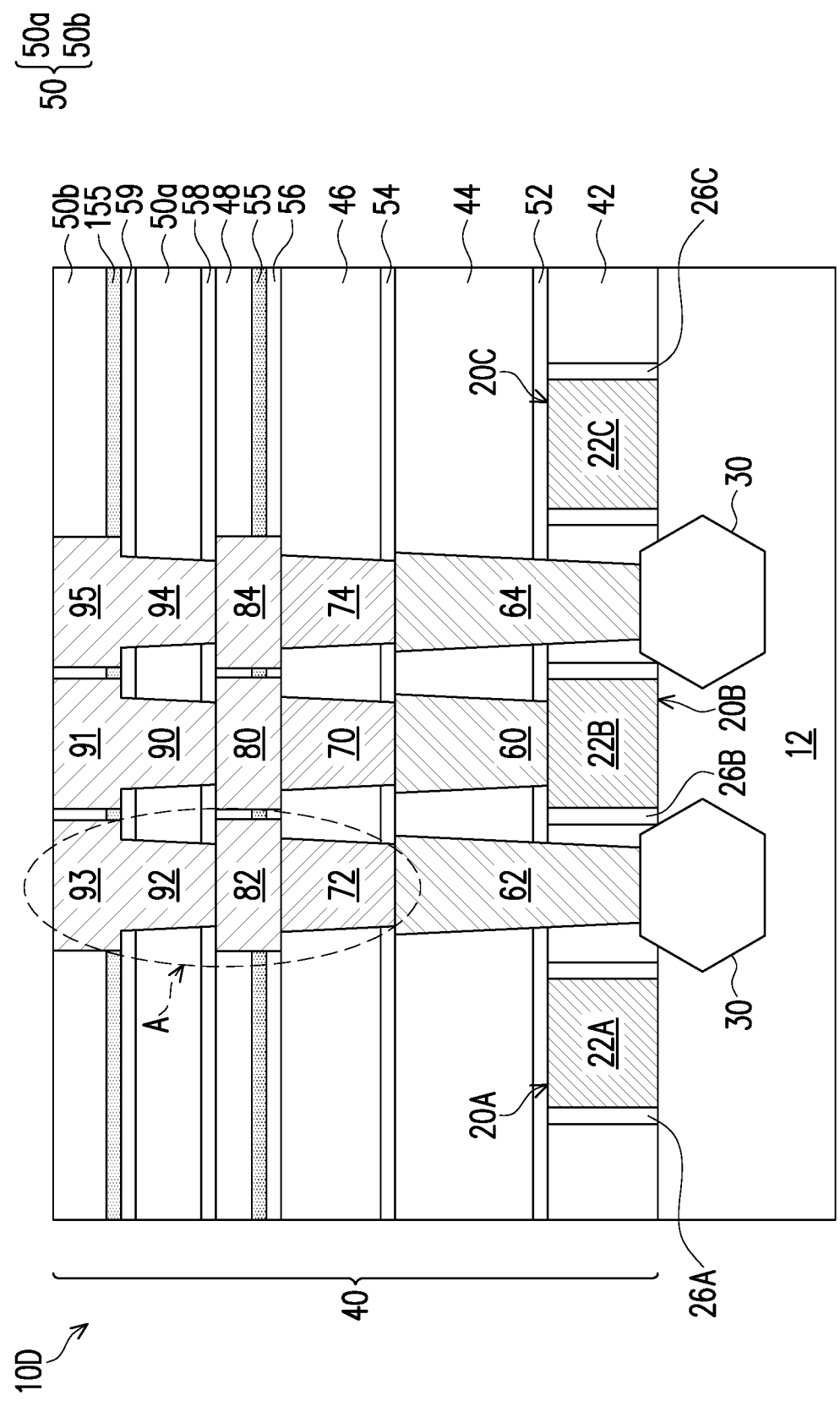
Figure 1E:
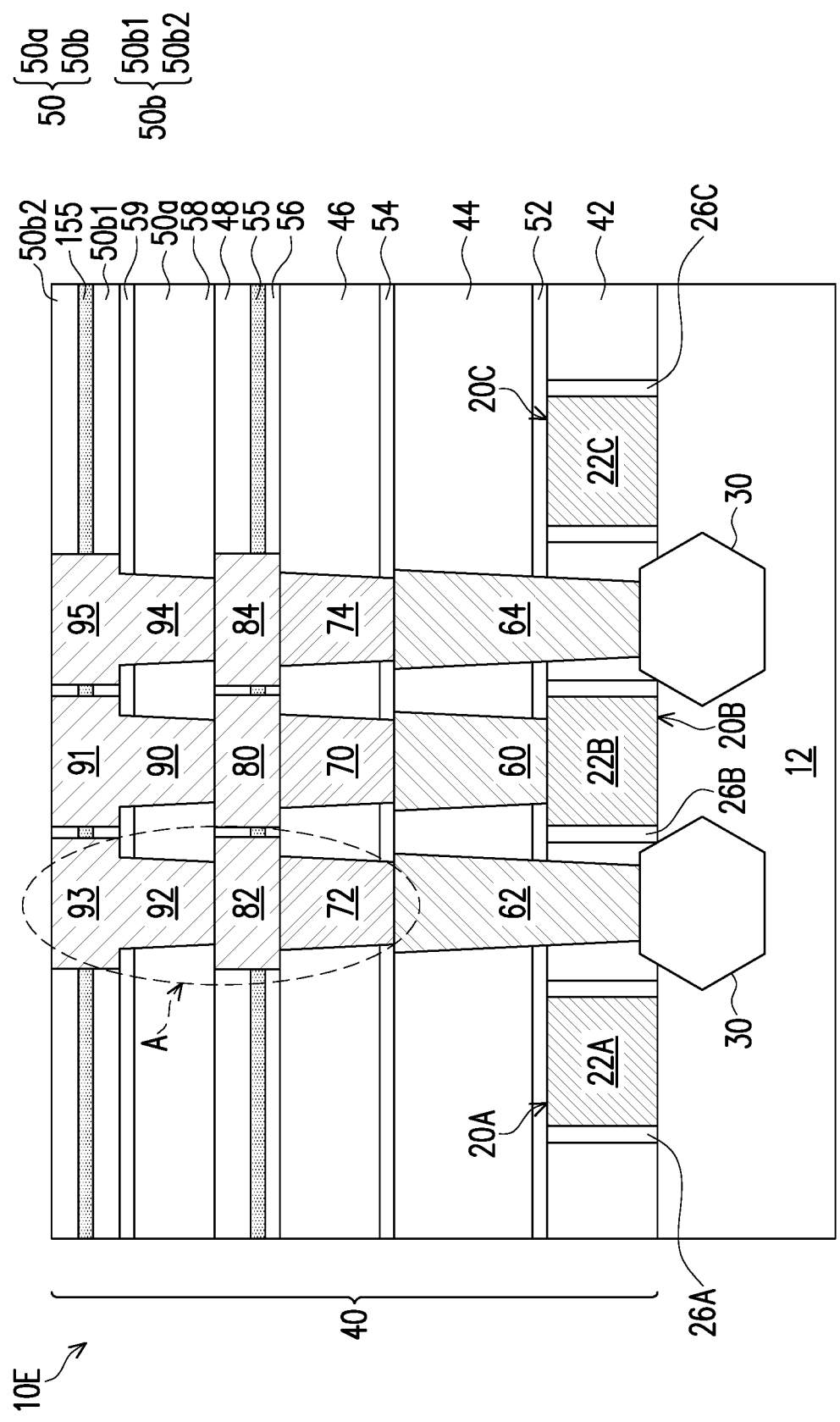

To address these challenges, IC manufacturers are seeking to improve methods of forming interconnect features with improved yield, capacitance, reliability, performance. According to embodiments of the present disclosure, an insert layer 55 is inserted in dielectric layer to increase the structure strength of the IMD layer 48 during forming trench openings for conductive lines 80-84. In some embodiments, insert layer 55 is inserted between CESL 56 and IMD layer 48 as shown in FIG. 1A. In alternative embodiments, insert layer 55 is embedded in IMD layer 48 as shown in FIG. 1B. In another embodiments, insert layer 55 is formed on the top surface of IMD layer 48 as shown in FIG. 1C. Insert layer 155 may be inserted in dielectric layer to increase the structure strength of the IMD layer 50 during forming dual damascene opening for dual damascene. In some embodiments, insert layer 155 is inserted between CESL 59 and second portion 50b of IMD layer 50 as shown in FIG. 1D. In alternative embodiments, insert layer 155 is embedded in second portion 50b of IMD layer 50 as shown in FIG. 1E.

Figure 1F:
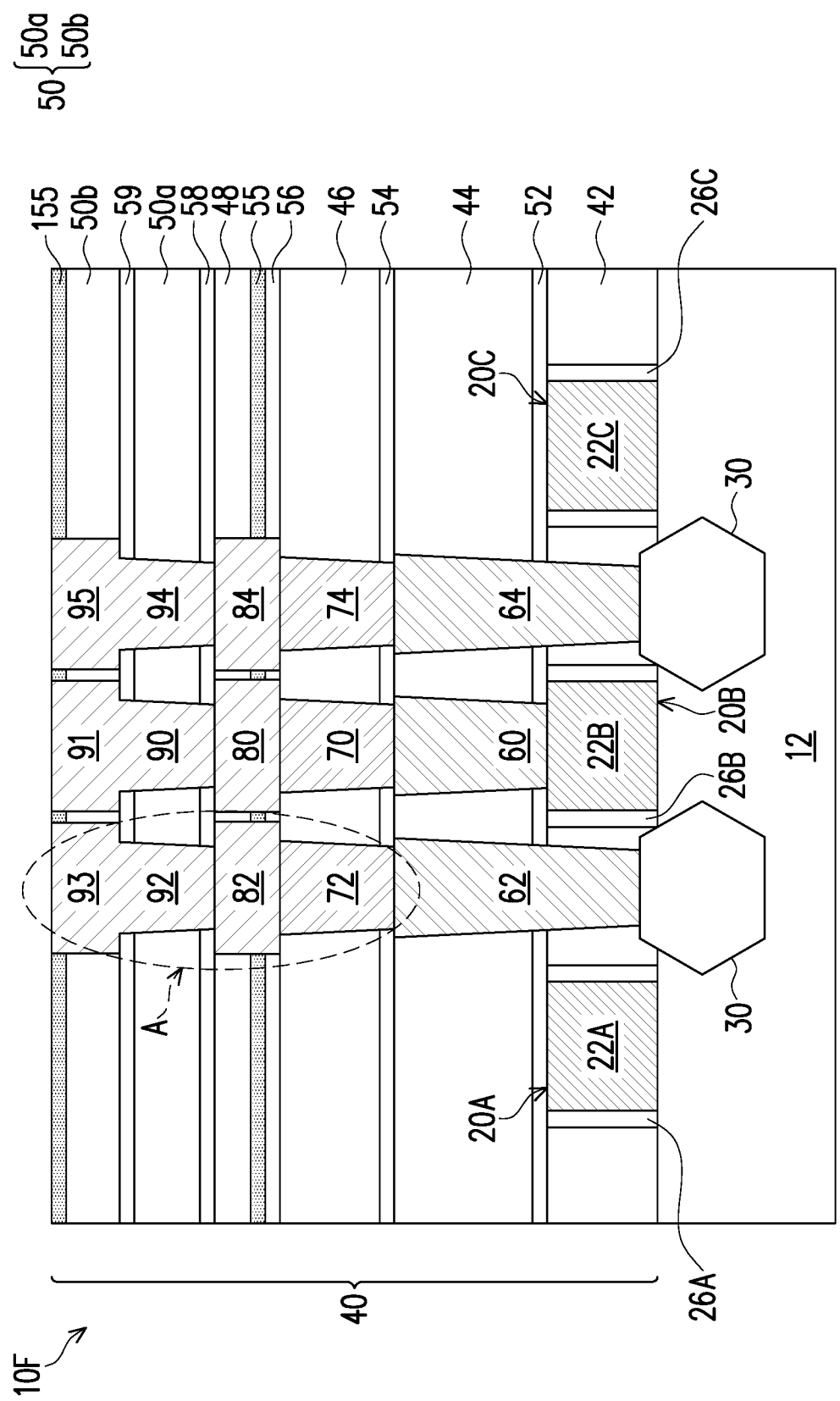

In another embodiments, insert layer 155 is formed on the top surface of second portion 50b of IMD layer 50 as shown in FIG. 1F.

Accordingly, embodiments of the present disclosure present many advantages. For example, the addition of insert layer helps mitigate issues related to collapsing, and/or bending that may occur during the patterning processes. Additionally, by inserting insert layer, a capacitance of IC device may be reduced, leading to reduction in the overall RC delay of the IC device.

Figure 2A:
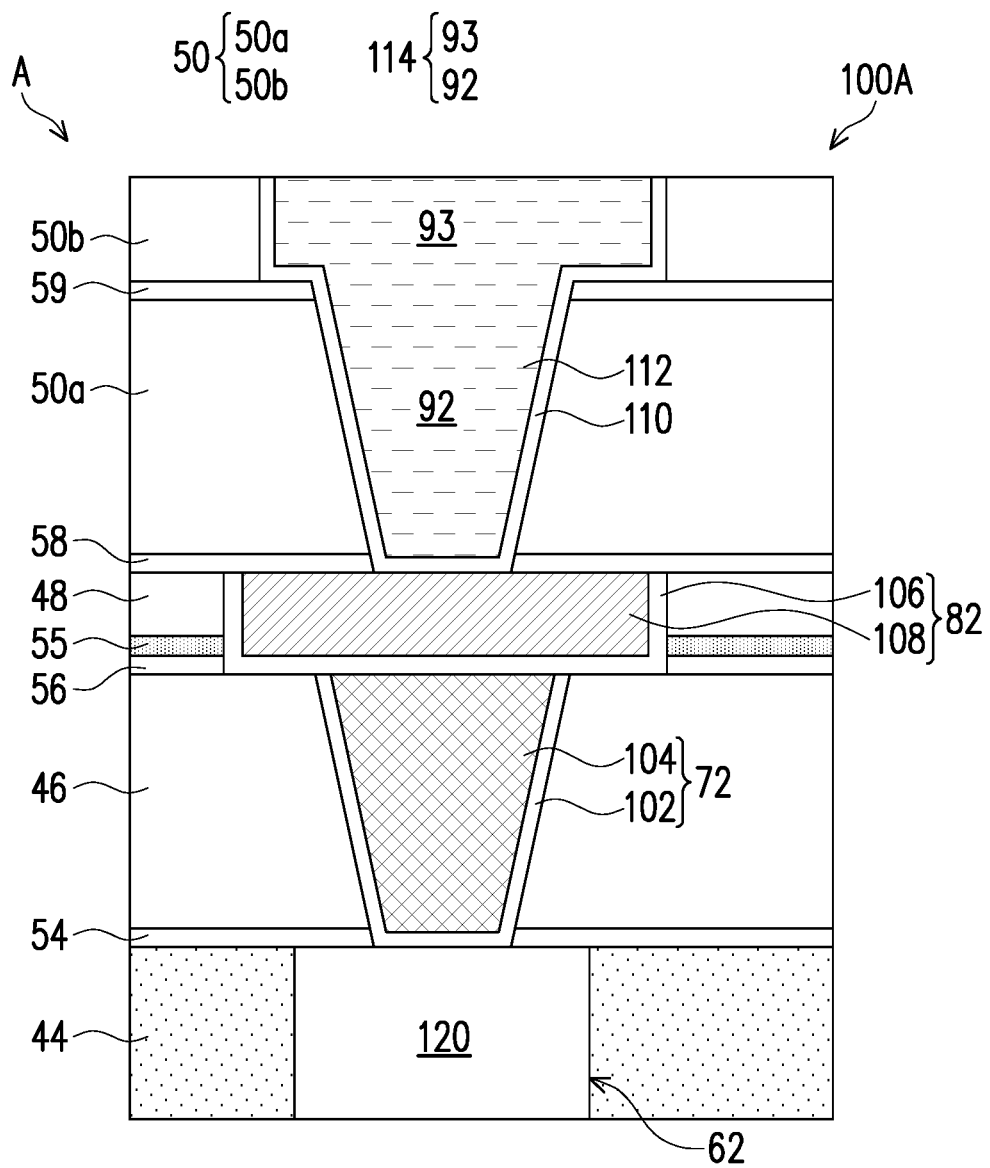
FIGS. 2A-2F are an enlarged fragmentary diagrammatic view of the integrated circuit device of FIG. 1A to 1F when implementing an interconnect structure, in portion or entirety, according to various embodiment of the present disclosure.

FIG. 2A is an enlarged fragmentary diagrammatic view of a portion A of integrated circuit device 10A (as shown in FIG. 1A) when implementing an interconnect structure 100A, in portion or entirety, according to various embodiment of the present disclosure. Interconnect structure 100A includes device-level contact 62, via 72, conductive line 82, via 92 and conductive line 93, where via 72 extends through ILD layer 46, and CESL 54 to interconnect device-level contact 62 to conductive line 82, and via 92 extends through first portion 50a of IMD layer 50 to interconnect conductive line 82 to conductive line 93. In some implementations, CESL 54, 56, 58 and/or CESL 59 are omitted from interconnect structure 100A. FIG. 2A has been simplified for the sake of clarity to better understand the inventive concepts of the present disclosure. Additional features may be added in interconnect structure 100A, and some of the features described below may be replaced, modified, or eliminated in other embodiments of interconnect structure 100A.

In FIG. 2A, device-level contact 62 is disposed in ILD layer 44. A bottom surface of via 72 and ILD layer 46 (and/or CESL 54) is disposed on a top surface of device-level contact 62 and ILD layer 44 is disposed on sidewalls of device-level contact 62. Though not depicted in FIG. 2A, a bottom of device-level contact 62 extends through CESL 52 and ILD layer 42 to epitaxial source/drain features 30, as shown in FIG. 1A. Device-level contact 62 includes a conductive bulk layer 120 comprising any suitable conductive material, such as Co, Ru, Cu, W, Ta, Ti, Al, TaN, TiN, other suitable conductive materials, or combinations thereof. Though not depicted, in some implementations, device-level contact 62 may further include other material layers, such as capping layers, barrier layers, adhesion layers, other suitable material layers, or combinations thereof.

Via 72 fills a via opening having sidewalls defined by ILD layer 46, and CESL 54, and a bottom surface defined by the top surface of device-level contact 62 (or topmost material layer included therein). Via 72 interconnects conductive line 82 to device-level contact 62. Via 72 includes a via bulk layer 104 comprising any suitable conductive material, such as Co, Ru, Cu, W, Ta, Ti, Al, graphene, nanotube, two-dimensional (2D) conductive materials, binary alloys, ternary alloys, metallic compounds (including, for example, Sc, V, Cr, Zr, Nb, Mo, Hf, Al, Si, P, S, Ga, Ge, As, Cd, In, Sn, Tl, Pb, C, N, or combinations thereof), other suitable conductive materials, or combinations thereof.

In the depicted embodiment, via 72 further includes a via barrier layer 102 disposed between via bulk layer 104 and surfaces defining via 72, such as sidewall surfaces defined by ILD layer 46, and CESL 54, and the bottom surface defined by top surface(s) of device-level contact 62 (or topmost material layer included therein). Via barrier layer 102 may be configured to facilitate adhesion of via bulk layer 104 to device-level contact 62, conductive line 82, and/or ILD layer 46. Via barrier layer 102 may include titanium, tantalum, tungsten, cobalt, manganese, nitrogen, self-assembled monolayers including silane, silanol, or silyl hydride, other suitable materials, or combinations thereof.

For example, via barrier layer 102 includes TiN, TaN, WN, CoN, MnN, other suitable materials, or combinations thereof. In many implementations, via barrier layer 102 prevents chemicals from diffusing into, attacking and/or consuming device-level contact 62 during subsequent processing. In the depicted embodiment, via barrier layer 102 has a thickness of less than about 50 nm.

Conductive line 82 fills a trench opening having sidewalls defined by IMD layer 48, insert layer 55, and CESL 56, and bottom surfaces defined by the top surface of ILD layer 46 and via 72 (or topmost material layer included therein). Conductive line 82 extends through IMD 48, insert layer 55 (and/or CESL 56) and CESL 56 to contact via 72. Conductive line 82 includes a conductive bulk layer 108 and a barrier layer 106. In the depicted embodiment, barrier layer 106 is disposed over a bottom surface and on sidewall surfaces of the conductive bulk layer 108. Further, barrier layer 106 disposed between conductive bulk layer 108 and surfaces defining conductive line 82, such as sidewall surfaces defined by IMD layer 48, insert layer 55 and CESL 56, and the bottom surfaces defined by top surface(s) of ILD layer 46 and via 72 (or topmost material layer included therein). Conductive bulk layer 108 includes any suitable conductive material, such as Co, Ru, Cu, W, Ta, Ti, Al, graphene, nanotube, two-dimensional (2D) conductive materials, binary alloys, ternary alloys, metallic compounds (including, for example, Sc, V, Cr, Zr, Nb, Mo, Hf, Al, Si, P, S, Ga, Ge, As, Cd, In, Sn, Tl, Pb, C, N, or combinations thereof), other suitable conductive materials, or combinations thereof. In the depicted embodiment, conductive bulk layer 108 includes Cu. In furtherance of embodiments, conductive bulk layer 108 includes a conductive material different from that of via bulk layer 104. In one example, conductive bulk layer 120 includes Co, via bulk layer 104 includes W, and conductive bulk layer 108 includes Cur. In the depicted embodiment, barrier layer 106 is formed to a thickness of less than about 50 nm. Barrier layer 106 may be similar to via barrier layer 102 in composition and may contain titanium, tantalum, tungsten, cobalt, manganese, nitrogen, other suitable materials, or combinations thereof. For example, barrier layer 106 includes TiN, TaN, WN, CoN, MnN, other suitable materials, or combinations thereof.

Insert layer 55 is formed between IMD layer 48 and CESL 56, and in contact with CESL 56. Insert layer 55 include a material different than CESL 56, and IMD layer 48, such as a dielectric material that is different than the dielectric materials of CESL 56 and IMD layer 48. The hardness of insert layer 55 is greater than that of IMD layer 48. In other words, insert layer 55 has a Young's modulus greater than a Young's modulus of the IMD layer 48. In some embodiments, the Young's modulus of IMD 48 ranges from 3 GPa to 6 Gpa, and the Young's modulus of insert layer 55 ranges from 8 GPa to 10 Gpa. The Young's modulus of insert layer 55 may be equal to or less than the Young's modulus of CESL 56. Insert layer 55 may be a single layer, a multi-layer, or a gradient layer.

In some embodiments, where IMD layer 48 includes a low-k dielectric material, the dielectric constant (k) of the insert layer 55 is less than the dielectric constant (k) of CESL 56, and greater than the dielectric constant (k) of IMD layer 48. In the depicted embodiment in which the dielectric constant (k) of IMD layer 48 ranges from 2.4 to 3.3, and the dielectric constant (k) of CESL 56 greater than 6.5, the dielectric constant (k) of insert layer 55 ranges from 3.3 to 6.

In some embodiments, materials of IMD layer 48 and insert layer 55 contains a same first atom such as silicon, while CESL 56 is free of the first atom. In alternative embodiments, materials of IMD layer 48 and insert layer 55 contains a same first atom such as silicon and a same second atom such as carbon, while CESL 56 is free of the first atom and the second atom. In other some embodiments, material of the CESL 56 contains a third atom selected from Group III, such as aluminum, and insert layer 55 and IMD layer 48 are free of the third atom.

In another embodiments, IMD layer 48 includes a low-k dielectric material containing silicon, oxygen, or/and carbon, and CESL 56 include aluminum oxide, insert layer 55 contains silicon, oxygen, nitrogen or/and carbon (for example, silicon nitride, silicon oxynitride, silicon oxycarbide, or combinations thereof). In the depicted embodiment, the low-k dielectric material of IMD layer 48 contains carbon of 5 at. % to 40 at. %, oxygen of 40 at. % to 55 at. %, and silicon of 30 at. % to 40 at. %, and CESL 56 includes aluminum oxide, insert layer 55 contains carbon of 0 at. % to 20 at. %, oxygen of 20 at. % to 70 at. %, and silicon of 30 at. % to 60 at. %. In the depicted embodiment, the silicon content of insert layer 55 is greater than the silicon content of IMD layer 48, and the silicon content of IMD layer 48 is greater than the silicon content of CESL 56, while the carbon content of CESL 56 is less than the carbon content of insert layer 55, and the carbon content of insert layer 55 is less than the carbon content of IMD layer 48.

The thickness of insert layer 55 is less than the thickness of IMD layer 48, and may be less than, equal to, or greater than the thickness of CESL 56. In some embodiments in which the thickness of IMD layer 48 ranges from 200 angstroms to 600 angstroms, and the thickness of CESL 56 ranges from 30 angstroms to 80 angstroms, the thickness of insert layer 55 ranges from 5 angstroms to 50 angstroms. In alternative embodiments, a ratio of the thickness of insert layer 55 to the thickness of IMD layer 48 ranges 1/25 to 1/8. If the ratio exceeds 1/8, the dielectric constant of the interconnect structure is too high. If the ratio is less than 1/25, the bending of IMD 48 cannot be effectively prevented during the patterning of IMD layer 48 for forming trench openings.

Insert layer 55 may be formed, for example, by a deposition process, such as CVD, PVD, ALD, PECVD, HDPCVD, MOCVD, RPCVD, LPCVD, ALCVD, APCVD, spin-on dielectric, plating, other suitable methods, or combinations thereof. In some implementations, CESL 56, insert layer 55 and/or IMD layers 48 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of CESL 56, insert layer 55 and/or IMD layers 48, a CMP process and/or other planarization process is performed, such that IMD layer 48 has substantially planar surfaces.

Dual damascene 114 is formed on and electrically connected to conductive line 82. Dual damascene 114 includes conductive line 93 and via 92. Conductive line 93 fills a trench opening of a dual damascene opening having sidewalls defined by second portion 50b of IMD layer 50 and a bottom surface defined by the top surface of CESL 59. Via 92 fills a via opening of dual damascene opening in spatial communication with trench opening, and having sidewalls defined by CESL 59, first portion 50a of IMD layer 50 and CESL 58 and a bottom surface defined by the top surface of the conductive line 82, for example, conductive bulk layer 108.

Conductive line 93 and via 92 includes a bulk layer 112 comprising conductive material(s) similar to that of via bulk layer 104 included in via 72, and a barrier layer 110 disposed between bulk layer 112 and surfaces defining via 92 and conductive line 93, such as the sidewalls defined by IMD layer 50 and CESLs 59 and 58, and the bottom surface defined by the top surface of conductive line 82 (such as conductive bulk layer 108). In some embodiments, barrier layer 110 is selectively deposited on sidewall surfaces defined by IMD layer 48. Barrier layer 110 may be similar to via barrier layer 102 formed in via 72 and may be configured to facilitate adhesion of bulk layer 112 to conductive line 82 and/or IMD layer 50.

Figure 2B:
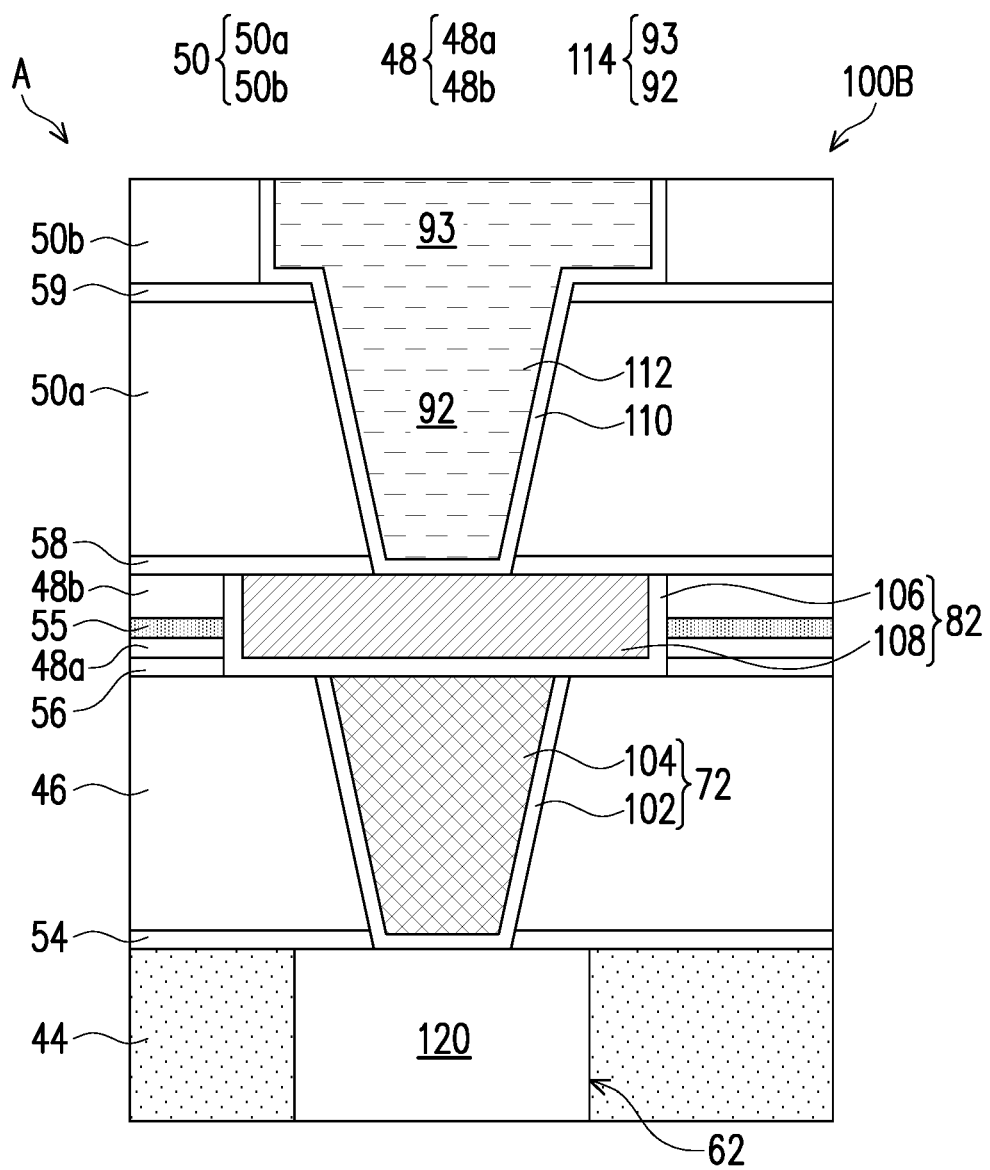

FIG. 2B is an enlarged fragmentary diagrammatic view of portion A of integrated circuit device 10B (as shown in FIG. 1B) when implementing an interconnect structure 100B, in a portion or entirety, according to various embodiment of the present disclosure. Interconnect structure 100B is similar to interconnect structure 100A, except insert layer 55 is embedded in IMD 48. Insert layer 55 is sandwiched between first portion 48a of IMD layer 48 and second portion 48b of IMD layer 48. Insert layer 55 may be a single layer, a multi-layer, or a gradient layer. Conductive line 82 fills a trench opening having sidewalls defined by second portion 48b of IMD layer 48, insert layer 55, a first portion 48a of IMD layer 48 and CESL 56, and bottom surfaces defined by the top surface of ILD layer 46 and via 72 (or topmost material layer included therein).

Similar to interconnect structure 100A, CESLs 54, 56, 58 and/or 59 may be omitted in interconnect structure 100B. FIG. 2B has been simplified for the sake of clarity to better understand the inventive concepts of the present disclosure. Additional features may be added in interconnect structure 100B, and some of the features described below may be replaced, modified, or eliminated in other embodiments of interconnect structure 100B.

Figure 2C:
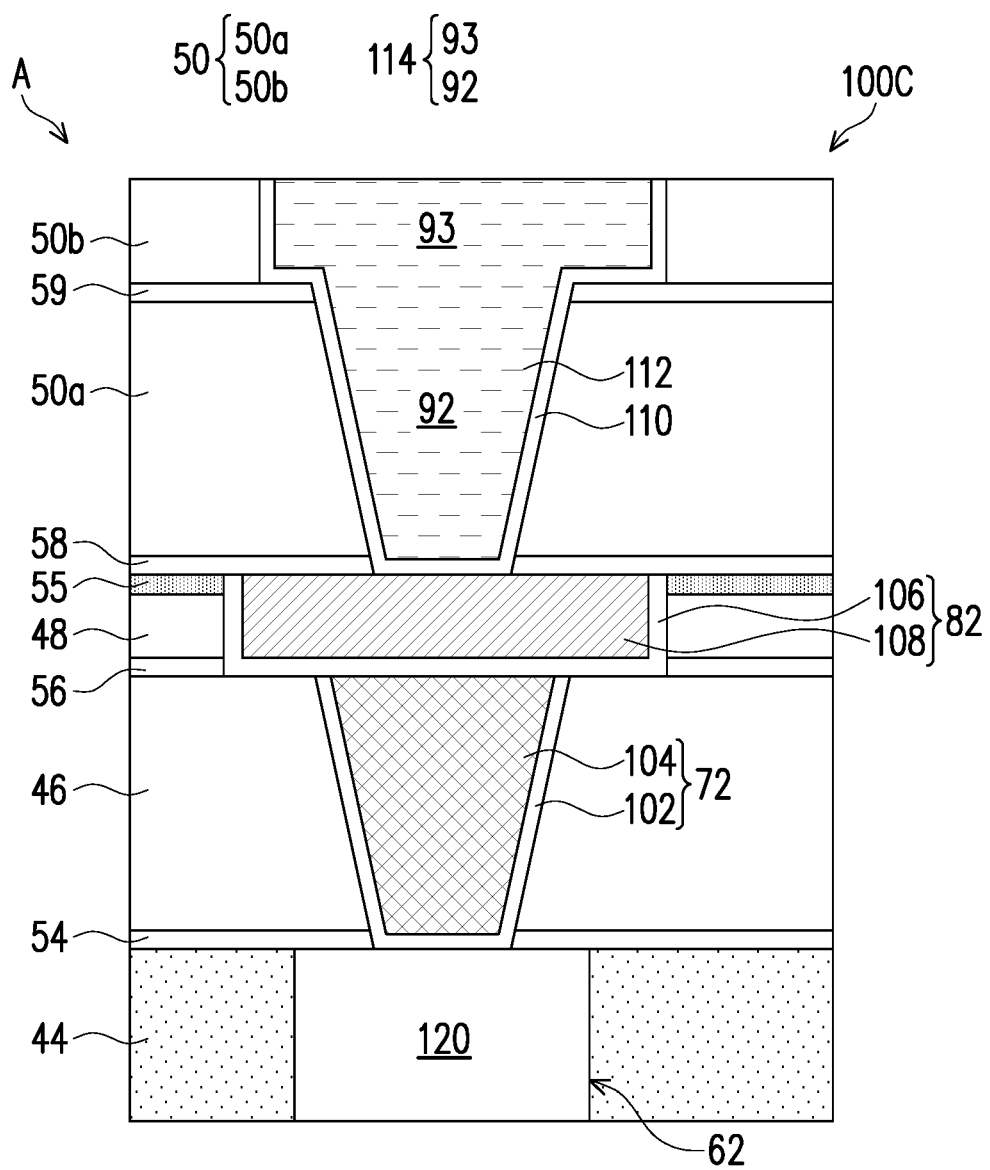

FIG. 2C is an enlarged fragmentary diagrammatic view of portion A of integrated circuit device 10C as shown in FIG. 1C when implementing an interconnect structure 100C, in portion or entirety, according to various embodiment of the present disclosure. Interconnect structure 100C is similar to interconnect structure 100A, except insert layer 55 is disposed on the top surface of IMD 48. Conductive line 82 fills a trench opening having sidewalls defined by insert layer 55, IMD layer 48, and CESL 56, and bottom surfaces defined by the top surface of ILD layer 46 and via 72 (or topmost material layer included therein). FIG. 2C has been simplified for the sake of clarity to better understand the inventive concepts of the present disclosure. Additional features may be added in interconnect structure 100C, and some of the features described below may be replaced, modified, or eliminated in other embodiments of interconnect structure 100C.

Figure 2D:
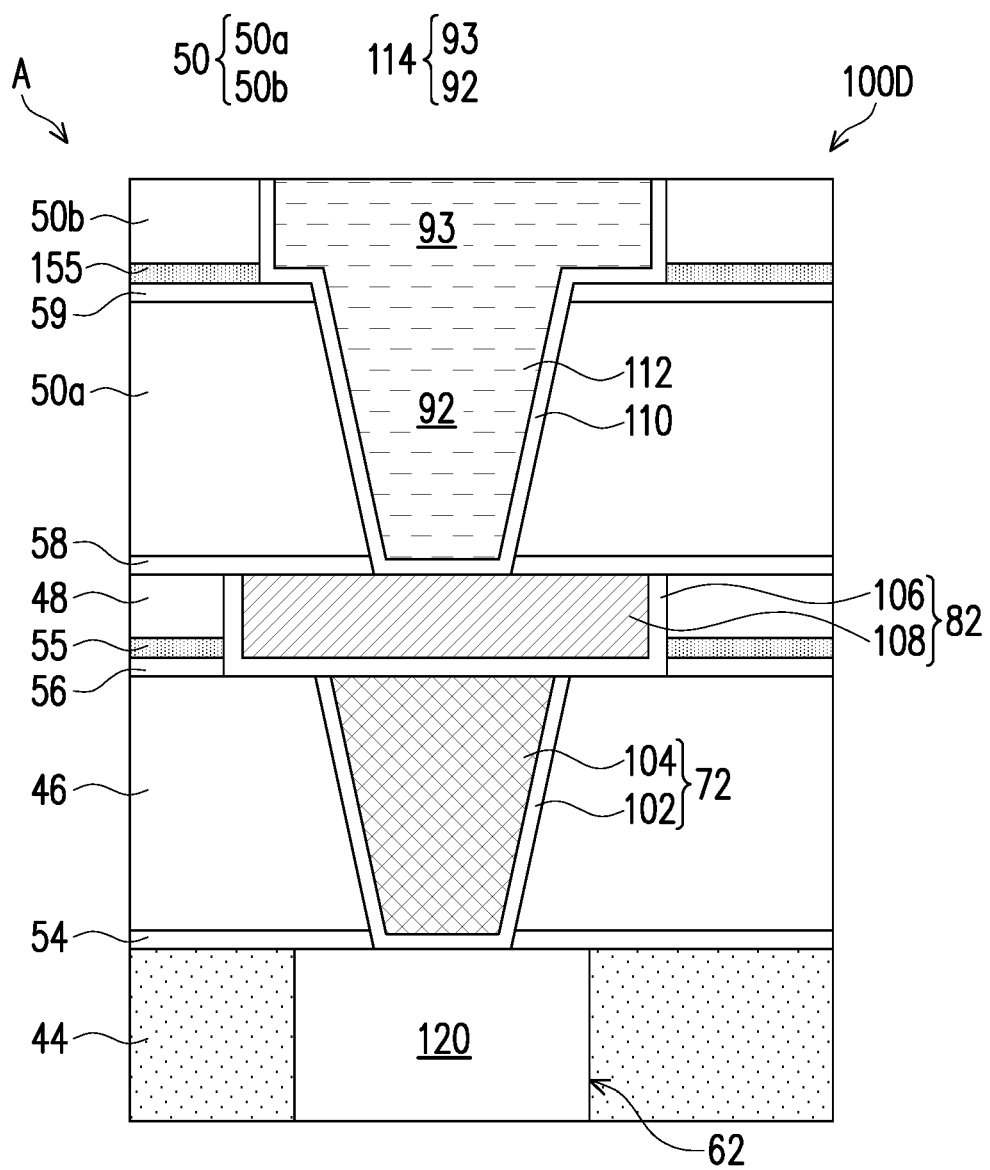

FIG. 2D is an enlarged fragmentary diagrammatic view of portion A of integrated circuit device 10D (as shown in FIG. 1D) when implementing an interconnect structure 100D, in portion or entirety, according to various embodiment of the present disclosure. Interconnect structure 100D is similar to interconnect structure 100A, except insert layer 155 is further disposed on the top surface of CESL 59, and in contact with CESL 59 and second portion 50b of IMD layer 50. Conductive line 93 fills a trench opening having sidewalls defined by a second portion 50b of IMD layer 50 and insert layer 155, and a bottom surface defined by top surfaces of CESL 59 (or topmost material layer included therein).

Insert layer 155 may be has a material the same as or similar to insert layer 55, and the formation of insert layer 155 may be has a material the same as or similar to insert layer 55. Insert layer 155 include a material different than CESL 59, and IMD layer 50, such as a dielectric material that is different than the dielectric materials of CESL 59 and IMD layer 50. The hardness of insert layer 155 is greater than that of IMD layer 50. In other words, insert layer 155 has a Young's modulus greater than a Young's modulus of the IMD layer 50. In some embodiments, the Young's modulus of IMD 50 ranges from 3 GPa to 6 Gpa, and the Young's modulus of insert layer 155 ranges from 8 GPa to 10 Gpa. The Young's modulus of insert layer 155 may be equal to or less than the Young's modulus of CESL 59. Insert layer 155 may be a single layer, a multi-layer, or a gradient layer.

In some embodiments, where IMD layer 50 includes a low-k dielectric material, the dielectric constant (k) of the insert layer 155 is less than the dielectric constant (k) of CESL 59, and greater than the dielectric constant (k) of IMD layer 50. In the depicted embodiment in which the dielectric constant (k) of IMD layer 50 ranges from 2.4 to 3.3, and the dielectric constant (k) of CESL 59 greater than 6.5, the dielectric constant (k) of insert layer 155 ranges from 3.3 to 6.

In some embodiments, materials of IMD layer 50 and insert layer 155 contains a same first atom selected from Group IV, such as silicon, and CESL 59 is free of the first atom. In alternative embodiments, materials of insert layer 155 and IMD layer 50 contains a same first atom selected from Group IV, such as silicon, and a same second atom selected from Group IV, such as carbon, and CESL 59 is free of the first atom and the second atom. In other some embodiments, material of the CESL 59 contains a third atom selected from Group III, such as aluminum, and insert layer 155 and IMD layer 50 are free of the third atom.

In another embodiments, IMD layer 50 includes a low-k dielectric material containing silicon, oxygen, or/and carbon, and CESL 59 include aluminum oxide, insert layer 155 contains silicon, oxygen, nitrogen or/and carbon (for example, silicon nitride, silicon oxynitride, silicon oxycarbide, or combinations thereof). In the depicted embodiment, the low-k dielectric material of IMD layer 50 contains carbon of 5 at. % to 40 at. %, oxygen of 40 at. % to 55 at. %, and silicon of 30 at. % to 40 at. %, and CESL 59 include aluminum oxide, insert layer 155 contains carbon of 0 at. % to 20 at. %, oxygen of 20 at. % to 75 at. %, and silicon of 30 at. % to 60 at. %. In the depicted embodiment, the silicon content of insert layer 155 is greater than the silicon content of IMD layer 50, and the silicon content of IMD layer 50 is greater than the silicon content of CESL 59, while the carbon content of CESL 59 is less than the carbon content of insert layer 155, and the carbon content of insert layer 155 is less than the carbon content of IMD layer 50.

The thickness of insert layer 155 is less than the thickness of IMD layer 50, and may be less than, equal to, or greater than the thickness of CESL 59. In some embodiments in which the thickness of second portion 50b of IMD layer 50 ranges from 200 angstroms to 600 angstroms, and the thickness of CESL 59 ranges from 30 angstroms to 80 angstroms, the thickness of insert layer 155 ranges from 5 angstroms to 50 angstroms. In alternative embodiments, a ratio of the thickness of insert layer 155 to the thickness of second portion 50b of IMD layer 50 ranges 1/15 to 1/5. If the ratio exceeds 1/5, the dielectric constant of the interconnect structure is too high. If the ratio is less than 1/15, the bending of second portion 50b of IMD layer 50 cannot be effectively prevented during the patterning of second portion 50b of IMD layer 50 for forming trench openings.

FIG. 2D has been simplified for the sake of clarity to better understand the inventive concepts of the present disclosure. Additional features may be added in interconnect structure 100D, and some of the features described below may be replaced, modified, or eliminated in other embodiments of interconnect structure 100D.

Figure 2E:
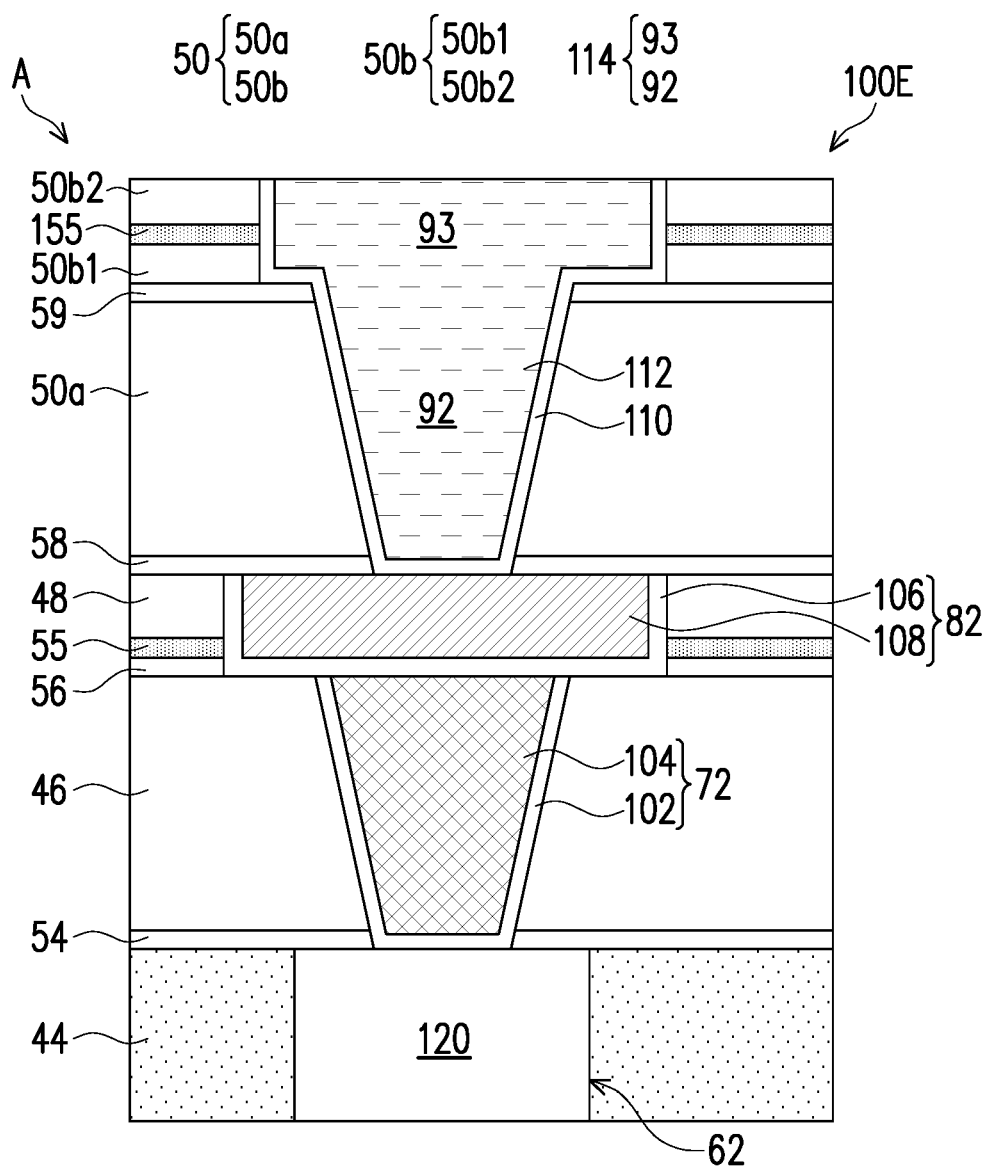

FIG. 2E is an enlarged fragmentary diagrammatic view of portion A of integrated circuit device 10E (as shown in FIG. 1E) when implementing an interconnect structure 100D, in portion or entirety, according to various embodiment of the present disclosure. Interconnect structure 100D is similar to interconnect structure 100D, except insert layer 155 is embedded in second portion 50b of IMD layer 50, and sandwiched between top part 50b2 and bottom part 50b1 of second portion 50b of IMD layer 50. Conductive line 93 fills a trench opening having sidewalls defined by top part 50b2 of second portion 50b of IMD layer 50, insert layer 155 and bottom part 50b1 of second portion 50b of IMD layer 50, and a bottom surface defined by top surfaces of CESL 59 (or topmost material layer included therein). FIG. 2E has been simplified for the sake of clarity to better understand the inventive concepts of the present disclosure. Additional features may be added in interconnect structure 100E, and some of the features described below may be replaced, modified, or eliminated in other embodiments of interconnect structure 100E.

Figure 2F:
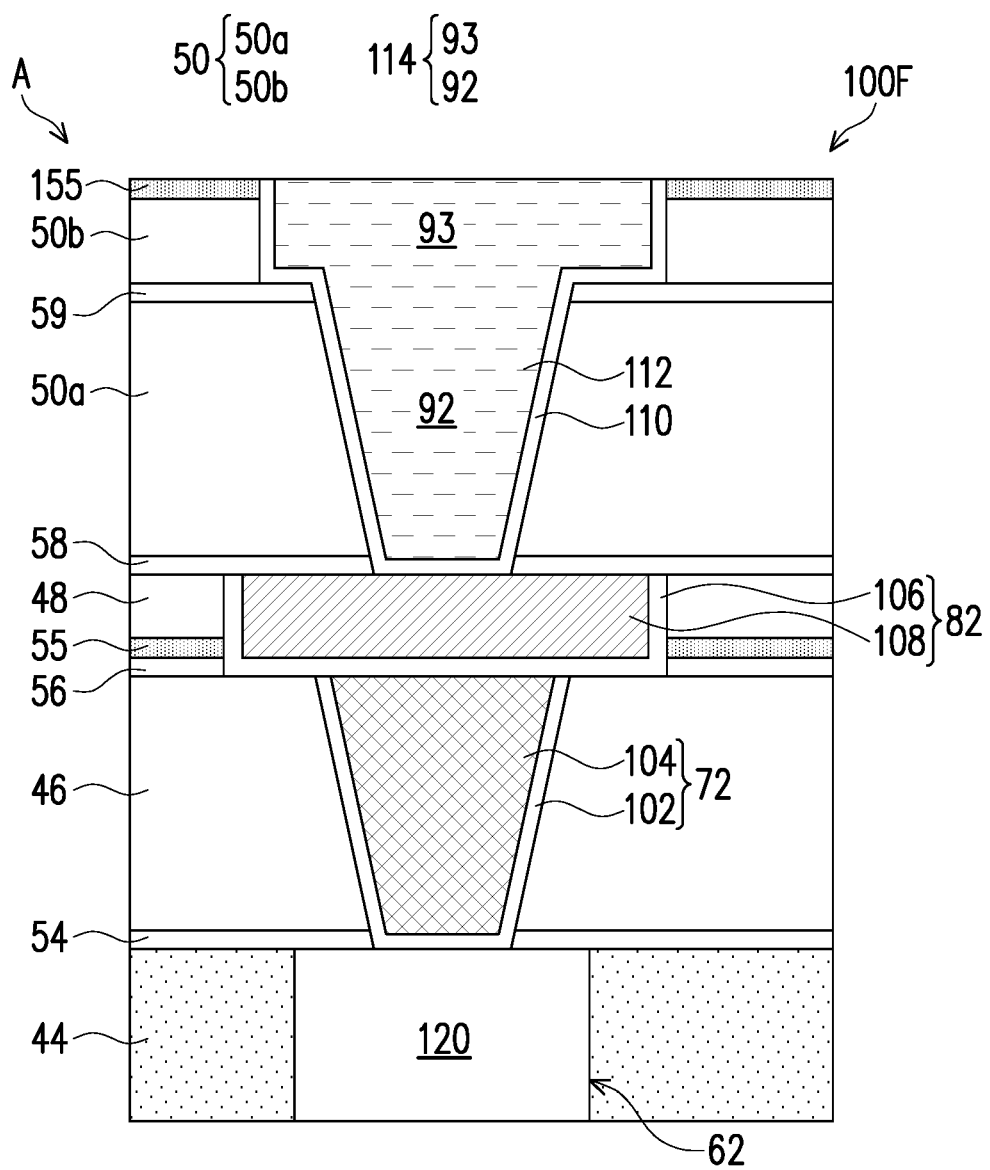

FIG. 2F is an enlarged fragmentary diagrammatic view of portion A of integrated circuit device 10F (as shown in FIG. 1F) when implementing an interconnect structure 100E, in portion or entirety, according to various embodiment of the present disclosure. Interconnect structure 100F is similar to interconnect structure 100D, except insert layer 155 is disposed on the top surface of second portion 50b of IMD layer 50. Conductive line 93 fills a trench opening having sidewalls defined by insert layer 155, and second portion 50b of IMD layer 50, and a bottom surface defined by top surfaces of CESL 59 (or topmost material layer included therein). FIG. 2F has been simplified for the sake of clarity to better understand the inventive concepts of the present disclosure. Additional features may be added in interconnect structure 100F, and some of the features described below may be replaced, modified, or eliminated in other embodiments of interconnect structure 100F.

Figure 3A:
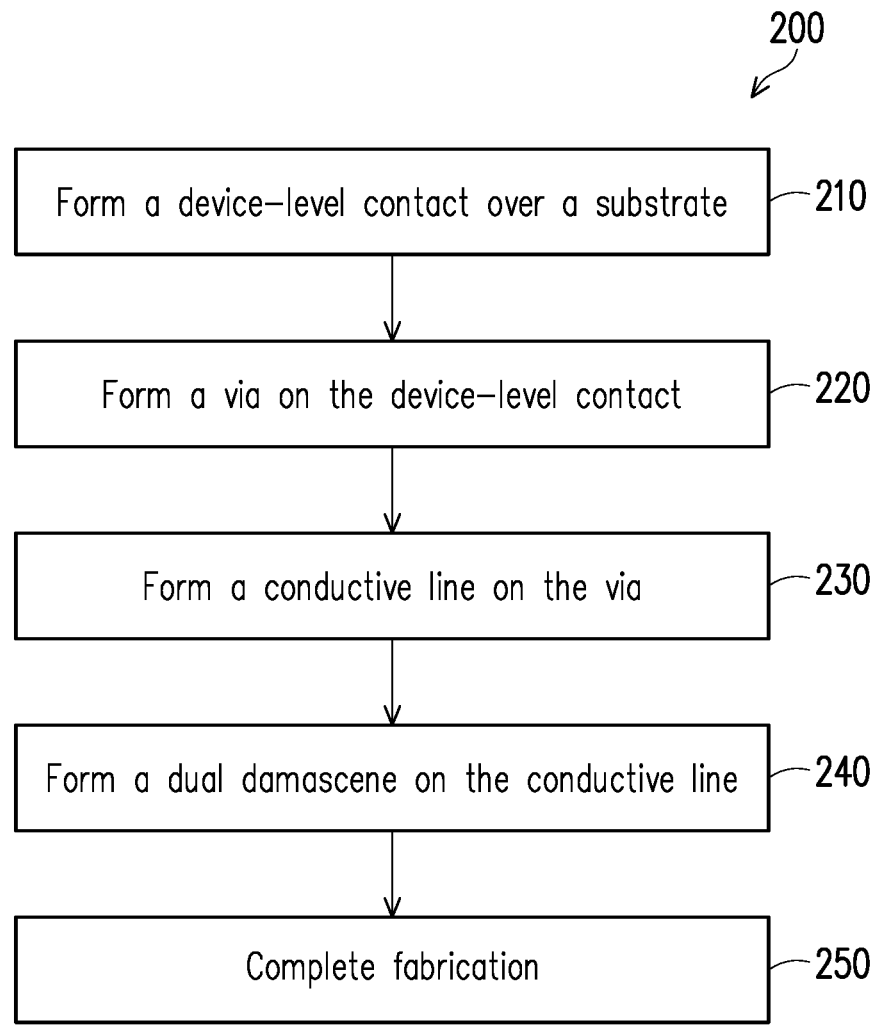
FIG. 3A is a flow chart of a method for fabricating an interconnect structure, such as the interconnect structures depicted in FIGS. 1A-2F and/or FIGS. 2A-2F, according to various embodiment of the present disclosure.

FIG. 3A is a flow chart of a method 200 for fabricating an interconnect structure, such as interconnect structures 100A-100C in FIGS. 2A-2C, according to various embodiment of the present disclosure. At block 210, method 200 includes forming a device-level contact over a substrate. At block 220, a via is formed on the device-level contact. At block 230, a conductive line is formed on the via. At block 240, the method 200 includes forming a dual damascene on the conductive line. At block 250, the method 200 may continue to complete fabrication of the interconnect structure. Additional steps may be provided before, during, and after method 200, and some of the steps described may be moved, replaced, or eliminated for additional embodiments of method 200.

Figure 3B:
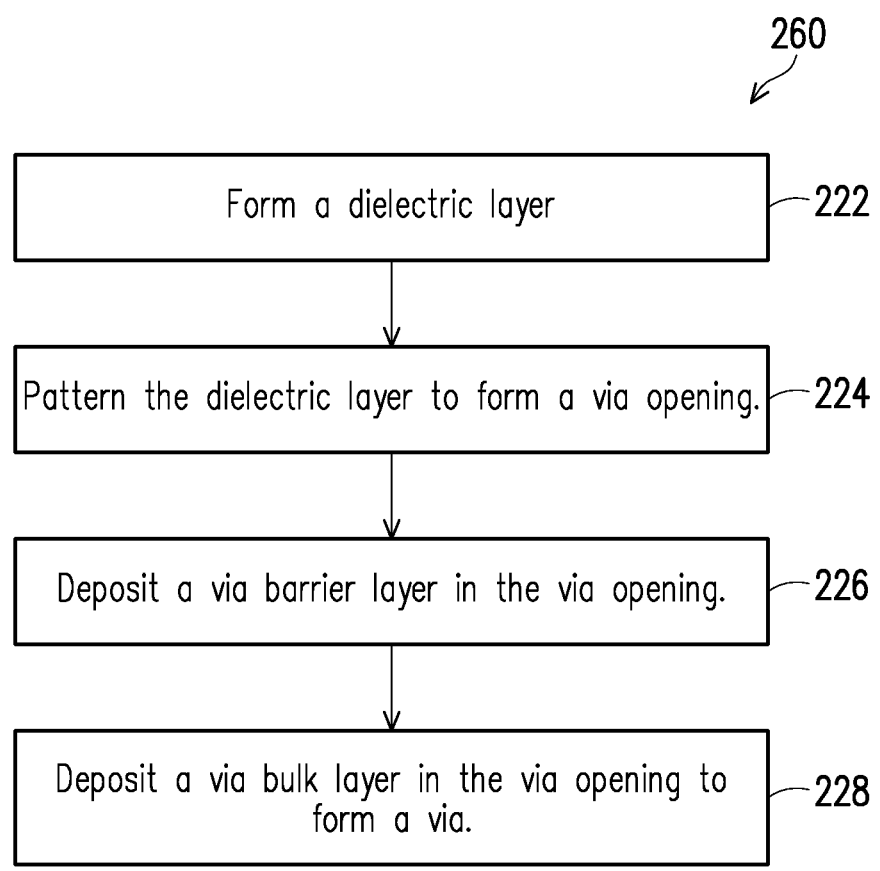
FIG. 3B is a flow chart of a method for fabricating a via of an interconnect structure, such as the interconnect structures depicted in FIGS. 1A-2F and/or FIGS. 2A-2F, according to various embodiment of the present disclosure.

FIG. 3B is a flow chart of a method 260 for fabricating a via of an interconnect structure, such as via 72 of interconnect structures 100A-100C in FIGS. 2A-2C, according to various embodiment of the present disclosure. In some implementations, method 260 may be implemented in method 200 at block 220. At block 222, method 260 includes forming a dielectric layer (such as ILD layer 46 of interconnect structures 100A-100C in FIGS. 2A-2C) on a conductive feature (such as device-level contact 62) and another dielectric layer (such as ILD layer 44). At block 224, a via opening is formed in dielectric layer. At block 226, a via barrier layer is formed in the via opening. Thereafter, at block 228, a via bulk layer is formed on the via barrier layer, such that the via barrier layer and the via bulk layer fill the via opening and form the via. In some embodiments, block 226 is omitted, such that no via barrier layer is formed in the via opening. As such, the via bulk layer may be directly formed on sidewall surfaces of the via opening defined by the dielectric layer and the device-level contact. Additional steps may be provided before, during, and after method 260, and some of the steps described may be moved, replaced, or eliminated for additional embodiments of method 260.

Figure 3C:
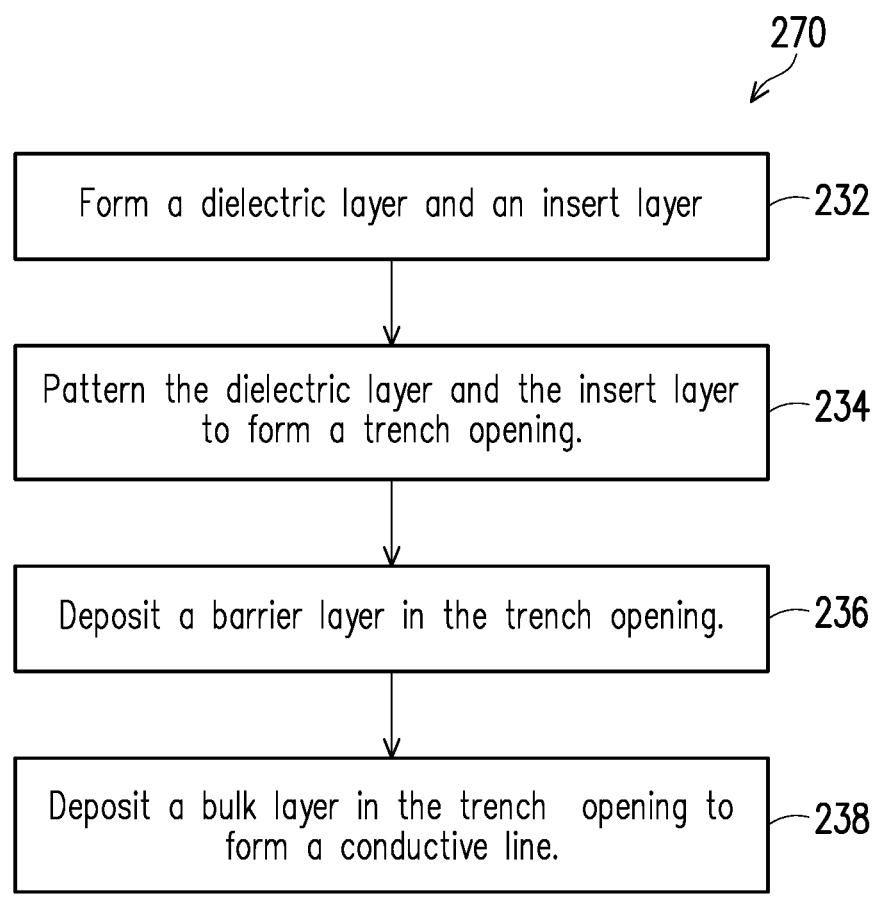
FIG. 3C is a flow chart of a method for fabricating a conductive line of an interconnect structure, such as the interconnect structures depicted in FIGS. 1A-2F and/or FIGS. 2A-2F, according to various embodiment of the present disclosure.

FIG. 3C is a flow chart of a method 270 for fabricating a conductive line of an interconnect structure, such as conductive line 82 of interconnect structures 100A-100C in FIGS. 2A-2C, according to various embodiment of the present disclosure. In some implementations, method 270 may be implemented in method 200 at block 230. At block 232, method 270 includes forming a dielectric layer (such as IMD layer 48 of interconnect structures 100A-100C in FIGS. 2A-2C) and an insert layer (such as insert layer 55) on a conductive feature (such as via 72) and another dielectric layer (such as ILD layer 46). At block 234, a trench opening is formed in dielectric layer and insert layer. At block 236, a barrier layer is formed in the trench opening. Thereafter, at block 238, a bulk layer is formed on the via barrier layer, such that the barrier layer and the bulk layer fill the trench opening and form conductive line. Additional steps may be provided before, during, and after method 270, and some of the steps described may be moved, replaced, or eliminated for additional embodiments of method 270.

Figure 3D:
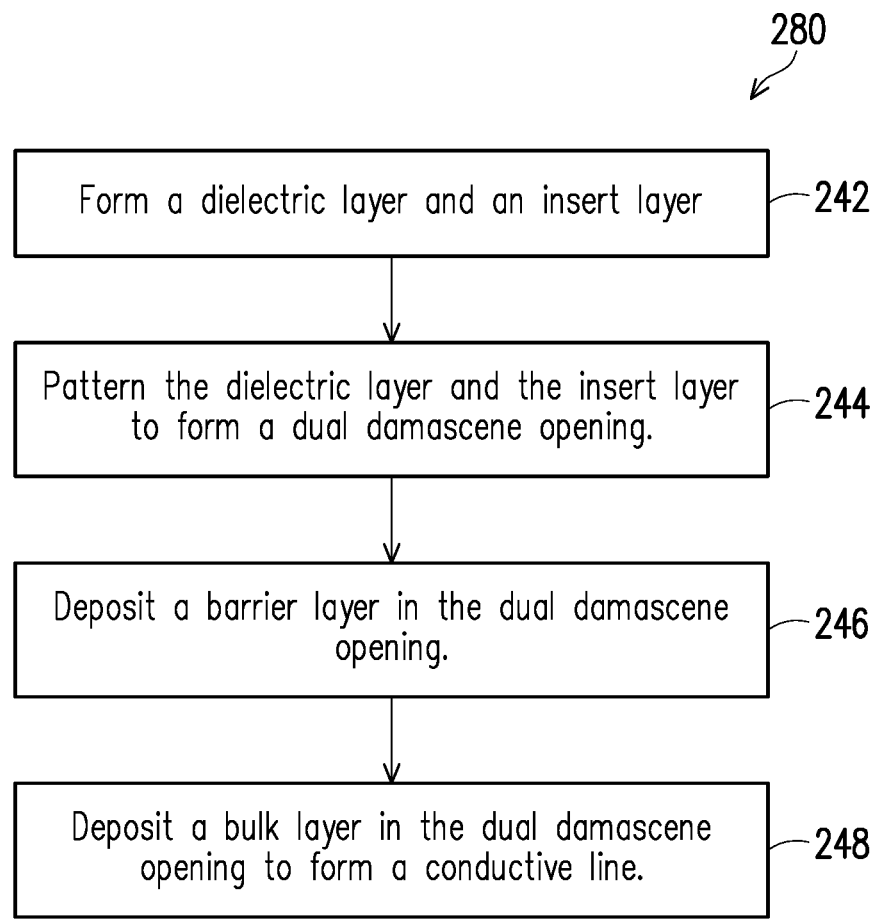
FIG. 3D is a flow chart of a method for fabricating a dual damascene of an interconnect structure, such as the interconnect structures depicted in FIGS. 1A-2F and/or FIGS. 2A-2F, according to various embodiment of the present disclosure.

FIG. 3D is a flow chart of a method 280 for fabricating a dual damascene of an interconnect structure, such as dual damascene 114 including conductive line 93 and via 92 of interconnect structures 100D-100F in FIGS. 2D-2F, according to various embodiment of the present disclosure. In some implementations, method 280 may be implemented in method 200 at block 240. At block 242, method 280 includes forming a dielectric layer (such as IMD layer 50 of interconnect structures 100D-100F in FIGS. 2D-2F) and an insert layer (such as insert layer 155) on a conductive feature (such as conductive line 82), and another dielectric layer (such as IMD layer 48). At block 244, a dual damascene opening is formed in dielectric layer and insert layer. At block 236, a barrier layer is formed in the dual damascene opening. Thereafter, at block 238, a bulk layer is formed on the barrier layer, such that the barrier layer and the bulk layer fill the dual damascene opening and form dual damascene. Additional steps may be provided before, during, and after method 280, and some of the steps described may be moved, replaced, or eliminated for additional embodiments of method 280.

FIGS. 4-17 are fragmentary diagrammatic views of an interconnect structure 300 of an integrated circuit device similar to integrated circuit device 10D as shown in FIG. 1D, in portion or entirety, at various fabrication stages (such as those associated with method 200 of FIG. 3A, method 260 of FIG. 3B, method 270 of FIG. 3C, and/or method 280 of FIG. 3C) according to various embodiment of the present disclosure. FIGS. 4-17 have been simplified for the sake of clarity to better understand the inventive concepts of the present disclosure. Additional features may be added in interconnect structure 300, and some of the features described below may be replaced, modified, or eliminated in other embodiments of interconnect structure 300.

Figure 4:
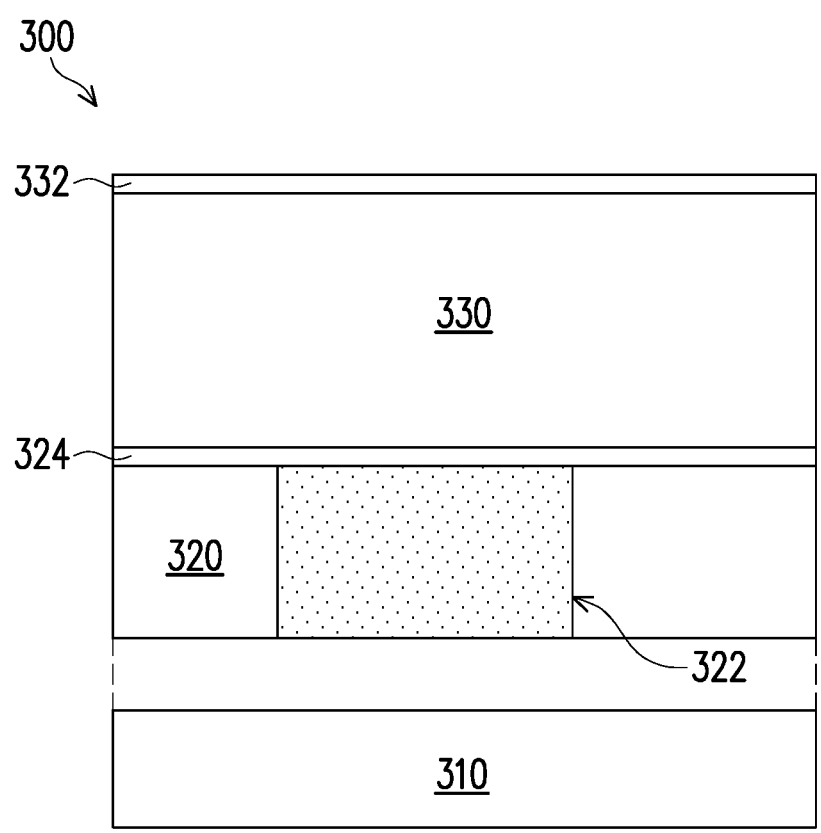
FIGS. 4 to 17 are fragmentary diagrammatic views of an interconnect structure, in portion or entirety, at various fabrication stages (such as those associated with the method of FIGS. 3A, 3B, 3C and/or 3D) according to various embodiment of the present disclosure.

In FIG. 4, referring to block 222 of FIG. 3B, a substrate 310 is provided having a conductive feature 322 disposed thereover. Substrate 310 is similar to substrate 12 depicted and described in FIGS. 1A-1C. In the depicted embodiment, conductive feature 322 is a MEOL feature similar to device-level contact 62 depicted and described in FIGS. 1A-1F and FIGS. 2A-2F. For example, conductive feature 322 includes a conductive bulk layer (not depicted) similar to conductive bulk layer 120 depicted and described in FIGS. 2A-2C. Alternatively, in some implementations, conductive feature 322 is a BEOL feature, such as conductive line 82 of MLI feature 40. In the depicted embodiment, conductive feature 322 is formed in a dielectric layer 320, which is similar to ILD layers 42-46 and IMD layers 48-50 depicted and described in FIGS. 1A-1F and FIGS. 2A-2F. In some implementations, conductive feature 322 is formed by any suitable deposition process (for example, PVD, CVD, ALD, or other suitable deposition process) and/or annealing process.

A dielectric layer 330, similar to ILD layers 42-46 and IMD layers 48-50 depicted and described in FIGS. 1A-1F and FIGS. 2A-2F, is formed over conductive feature 322 and dielectric layer 320. For example, CVD such as PECVD, spin-on dielectric, other suitable process, or combinations thereof is performed to deposit a low-k dielectric material over conductive feature 322 and dielectric layer 320, thereby forming dielectric layer 330. As depicted, a CESL 324, similar to CESLs 52-59 depicted and described in FIGS. 1A-1F and FIGS. 2A-2F, may be formed over dielectric layer 320 and conductive feature 322 before forming dielectric layer 330, and CESL 332 may be formed over dielectric layer 330. CESLs 324 and 332 each include a material having a different etching characteristic than a material of dielectric layer 330, such as aluminum oxide.

Figure 5:
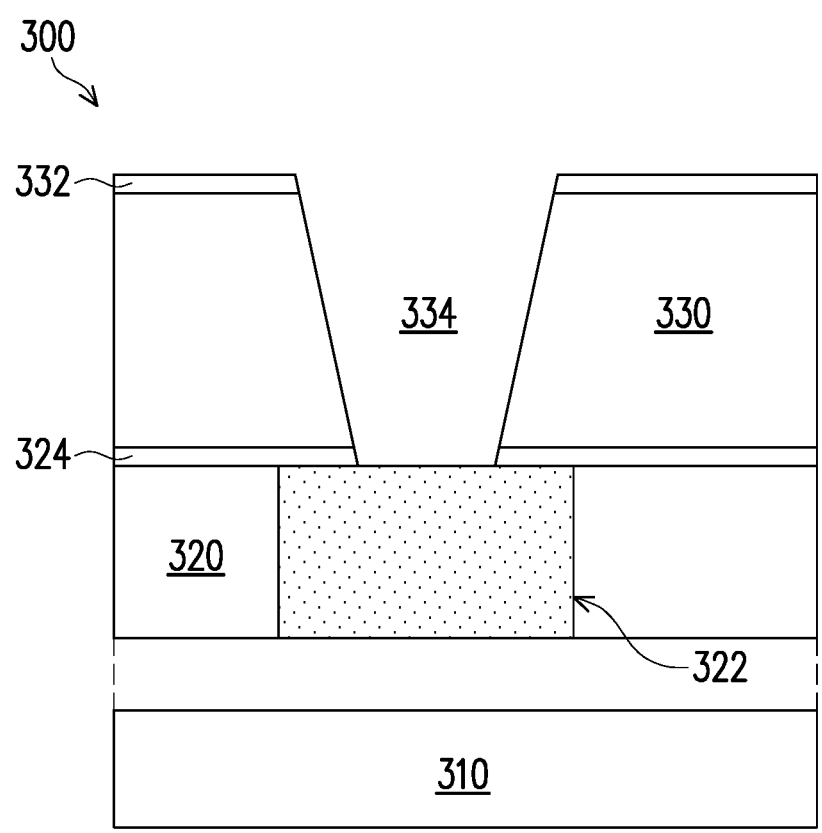

In FIG. 5, referring to block 224 of FIG. 3B, a via opening 334 is formed in dielectric layer 330 (and, in some implementations, CESL 324, and/or CESL 332) by a patterning process. In the depicted embodiment, via opening 334 extends through CESL 332, dielectric layer 330, and CESL 324. Via opening 334 has sidewalls defined by dielectric layer 330 (and CESL 324 and/or CESL 332) and a bottom surface defined by conductive feature 322. The patterning process includes lithography processes and/or etching processes. For example, forming via opening 334 includes performing a lithography process to form a patterned resist layer over dielectric layer 330 and performing an etching process to transfer a pattern defined in the patterned resist layer to dielectric layer 330. The lithography process may include forming a resist layer on dielectric layer 330 (for example, by spin coating), performing a pre-exposure baking process, performing an exposure process using a mask, performing a post-exposure baking process, and performing a developing process. After development, the patterned resist layer includes a resist pattern that corresponds with the mask. The etching process uses the patterned resist layer as an etch mask to remove portions of dielectric layer 330. The etching process may include a dry etching process (for example, a reactive ion etching (RIE) process), a wet etching process, other suitable etching process, or combinations thereof. After the etching process, the patterned resist layer is removed from dielectric layer 330, for example, by a resist stripping process. In some implementations, the patterned resist layer is used as an etch mask to remove portions of CESL 332, dielectric layer 330 and/or CESL 332 to extend via opening 334, thereby exposing conductive feature 322. Various selective etching processes may be performed. Alternatively, the exposure process may be implemented or replaced by other methods, such as maskless lithography, electron-beam (e-beam) writing, ion-beam writing, and/or nanoimprint technology.

Figure 6:
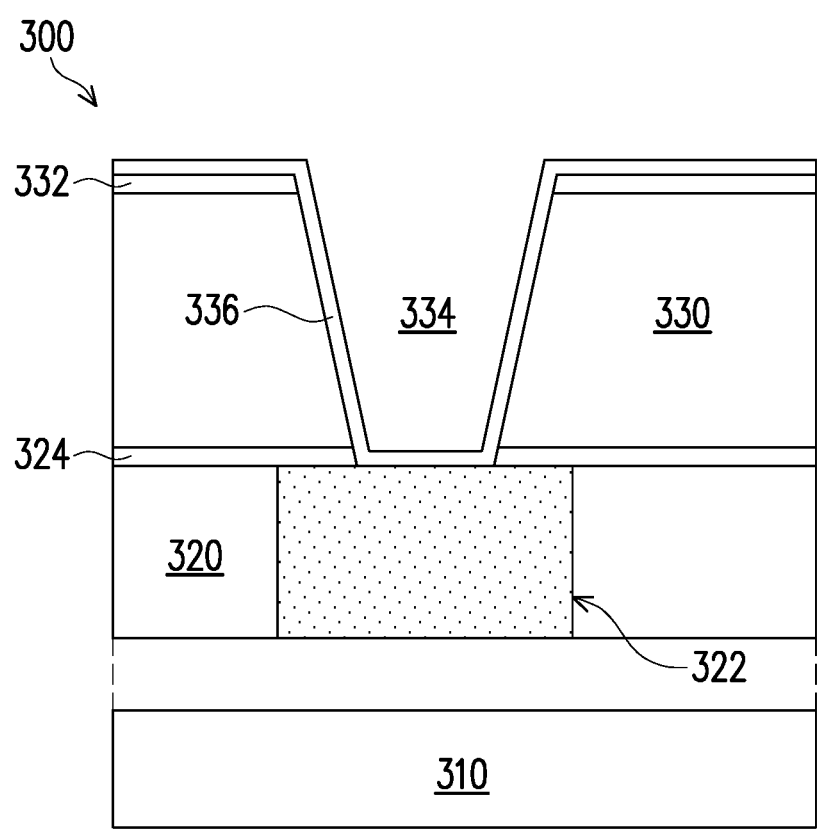

In FIG. 6, referring to block 224 of FIG. 3B, a via barrier layer 336 is formed in via opening 334. Via barrier layer 336 is similar to via barrier layer 102 depicted and described in FIGS. 2A-2F. For example, via barrier layer 336 includes TiN, TaN, WN, CoN, MnN, other suitable material, or combinations thereof. Via barrier layer 336 is disposed along sidewall and bottom surfaces that define via opening 334, such that via barrier layer 336 partially fills via opening 334. In the depicted embodiment, via barrier layer 336 is disposed directly on portions of dielectric layer 330 and conductive feature 322 that define via opening 334, as well as over a top surface of CESL 332. In furtherance of the depicted embodiment, via barrier layer 336 is conformally deposited in via opening 334, such that via barrier layer 336 has a thickness that is substantially uniform over exposed surfaces of interconnect structure 300. Still further, the depicted embodiment provides that via barrier layer 336 is formed by PVD, CVD, ALD, electroless plating, other suitable deposition process, or combinations thereof.

Figure 7:
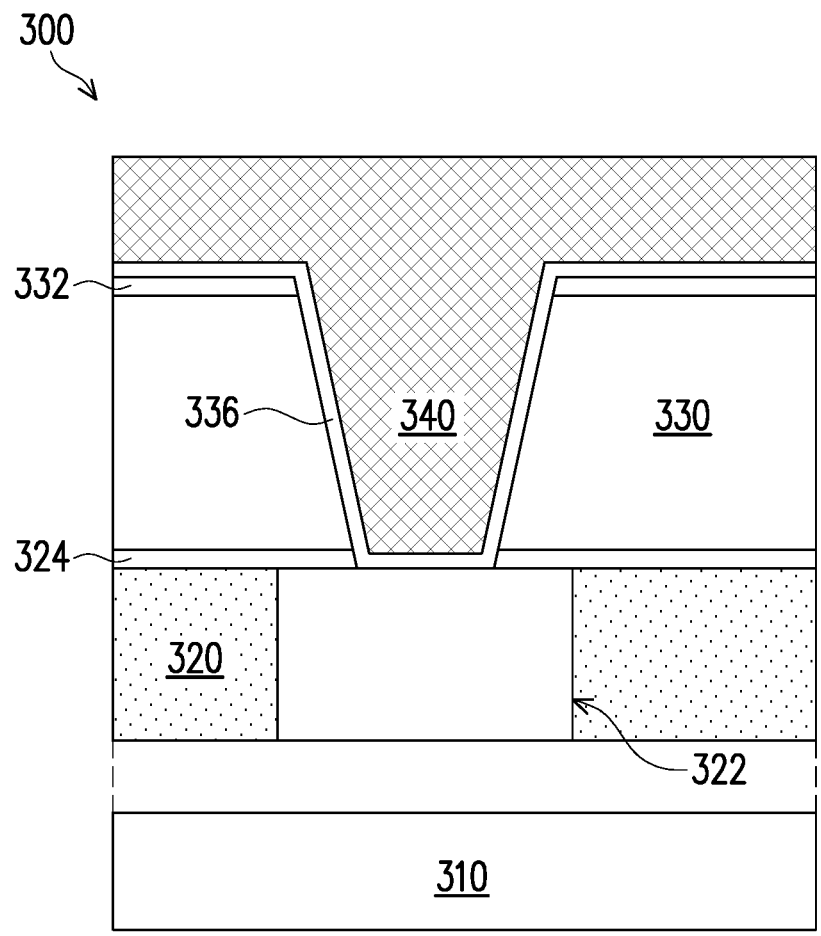

In FIG. 7, referring to block 228 of FIG. 3B, and further to the embodiment depicted in FIGS. 2A-2F, a via bulk layer 340 is formed in via opening 334. Via bulk layer 340 is similar to via bulk layer 104 depicted and described in FIGS. 2A-2F. In some embodiments, via bulk layer 340 may include a seed layer disposed below a fill layer. For example, via bulk layer 340 may include a copper-containing seed layer and a copper-containing fill layer disposed over the copper-containing seed layer. In the depicted embodiment, via bulk layer 340 includes a conductive material having a lower resistivity than copper, such as a cobalt-containing fill layer or a ruthenium-containing fill layer. Via bulk layer 340 is formed over via barrier layer 336, such that via bulk layer 340 fills any remaining space in via opening 334. In the depicted embodiment, via bulk layer 340 is formed by PVD, CVD, ALD, electroplating, electroless plating, other suitable deposition process, or combinations thereof.

Figure 8:
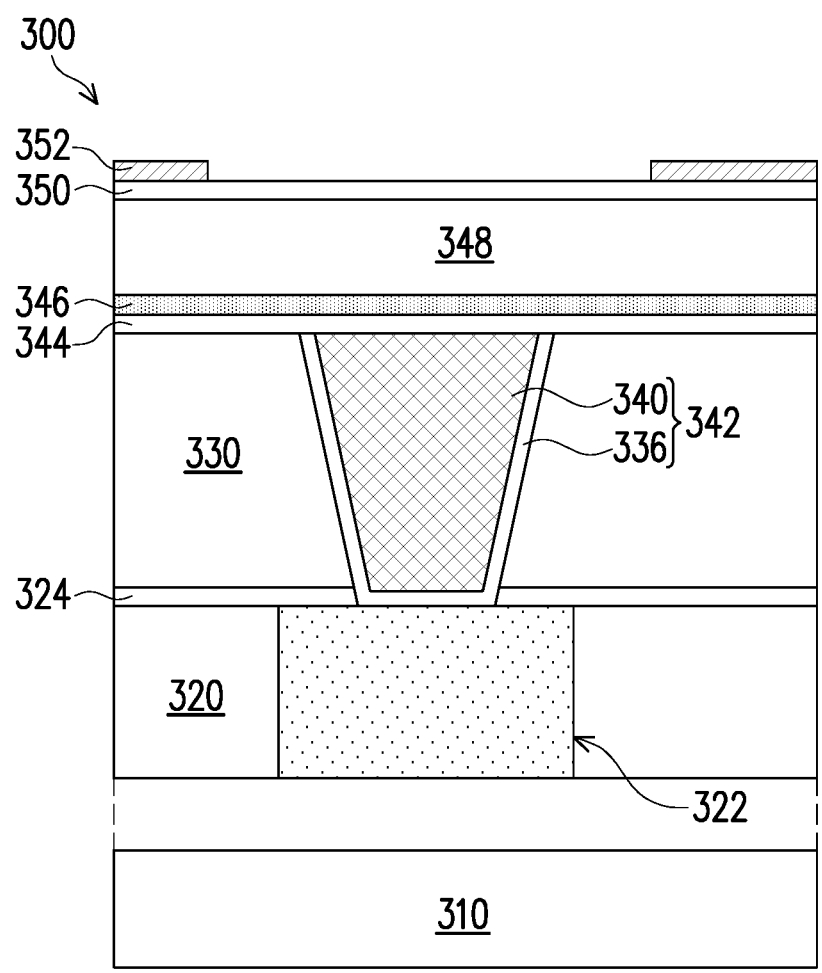

In FIG. 8, a CMP process and/or other planarization process is performed on interconnect structure 300. The CMP process removes excessive via barrier layer 336 and/or via bulk layer 340 and/or CESL 332, resulting in a via 342 that includes via barrier layer 336 and via bulk layer 340 (which together fill via opening 334) is formed. In the depicted embodiment, the CMP process removes via barrier layer 336 and CESL 332 formed over a top surface of dielectric layer 330, such that a top surface of dielectric layer 330 and a top surface of via 342 form a substantially planar surface.

In FIG. 8, referring to block 232 of FIG. 3C, an insert layer 346, similar to insert layers 55 and 155 depicted and described in FIGS. 1A-1F and FIGS. 2A-2F, is formed over dielectric layer 330 and via 342. For example, CVD such as PECVD, spin-on dielectric, other suitable process, or combinations thereof is performed to deposit a material containing silicon, oxygen, nitrogen or/and carbon (for example, silicon carbide (SiC), silicon oxycarbide (SiCO), silicon carbon oxynitride (SiCON), silicon nitride (SiN), silicon oxynitride (SiON), or combinations thereof) over dielectric layer 330 and via 342, thereby forming insert layer 346. A dielectric layer 348, similar to IMD layers 48-50 depicted and described in FIGS. 1A-1F and FIGS. 2A-2F, is formed over insert layer 346. For example, CVD such as PECVD, spin-on dielectric, other suitable process, or combinations thereof is performed to deposit a low-k dielectric material over insert layer 346, thereby forming dielectric layer 348. As depicted, a CESL 344 may be formed over the dielectric layer 330 and via 342 before forming the insert layer 346. CESL 344 includes a material having a different etching characteristic than a material of dielectric layer 330, such as aluminum oxide. In the depicted embodiment, the low-k dielectric material of dielectric layer 348 contains carbon of 5 at. % to 40 at. %, oxygen of 40 at. % to 55 at. %, and silicon of 30 at. % to 40 at. %, and CESL 59 include aluminum oxide, insert layer 346 contains carbon of 0 at. % to 20 at. %, oxygen of 20 at. % to 70 at. %, and silicon of 30 at. % to 60 at. %.

Figure 9:
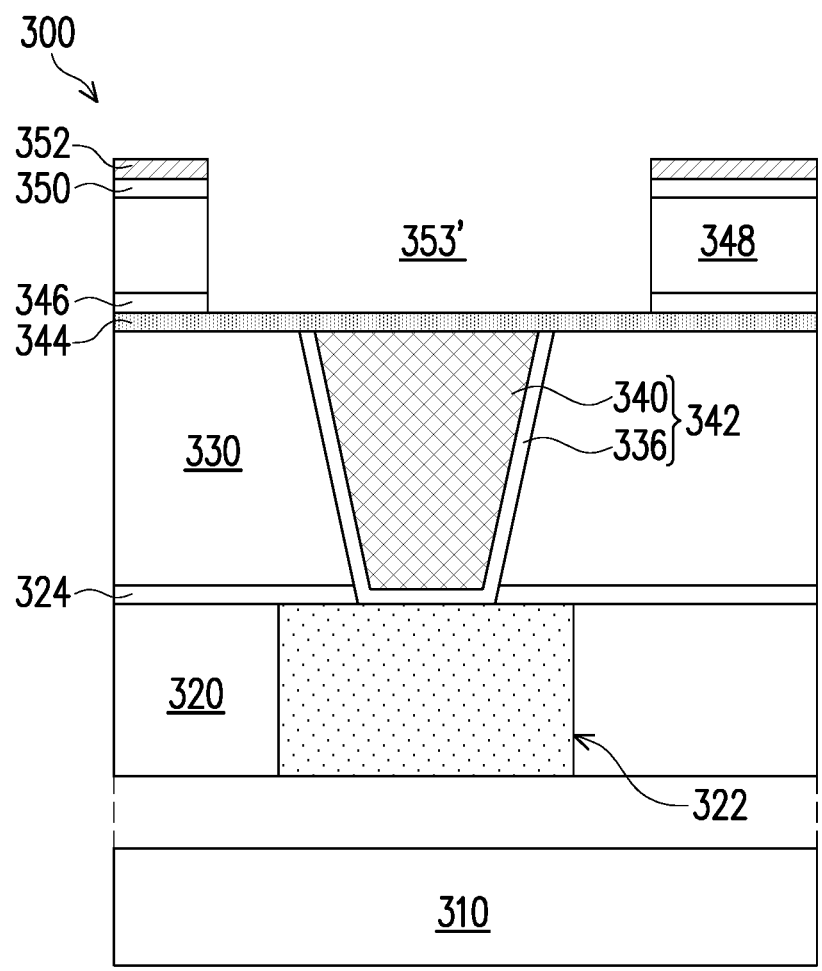
Figure 10:
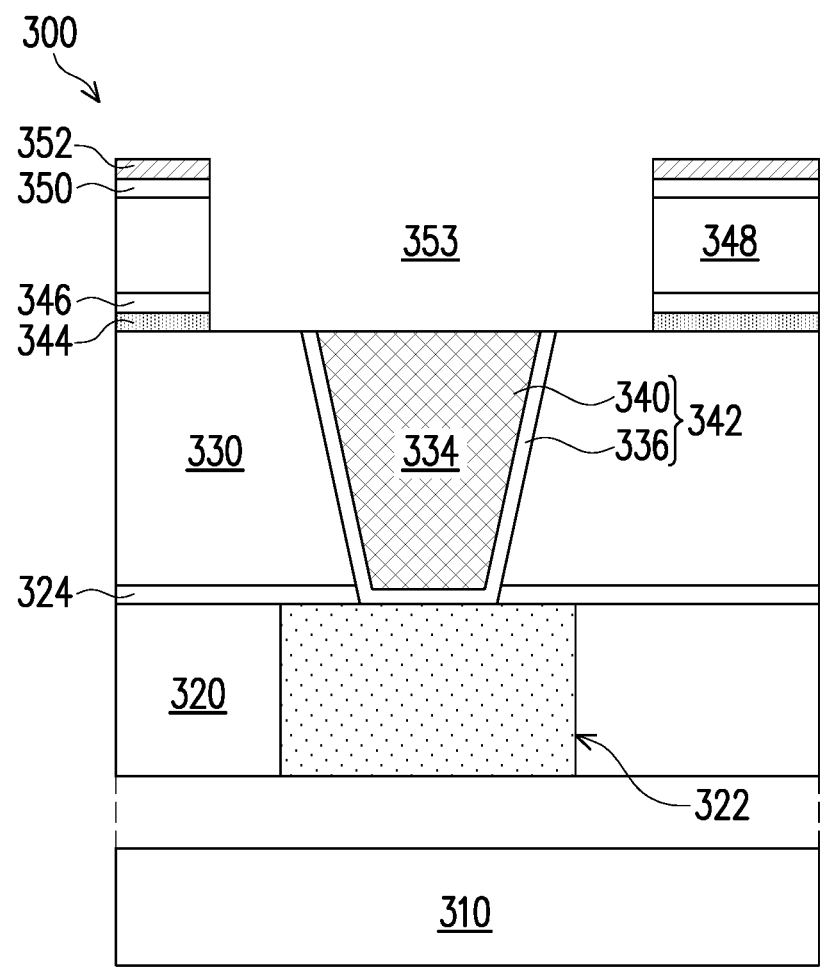

In FIGS. 8-10, referring to block 234 of FIG. 3C, a trench opening 353 is formed in dielectric layer 348 and insert layer 346 (and, in some implementations, CESL 344) by a patterning process. The patterning process includes lithography processes and/or etching processes. For example, forming trench opening 353 includes the following processes. A dielectric cap 350 and a metal cap 352 are formed on dielectric layer 348, and a lithography process is performing to form a patterned resist layer over metal cap 352. Dielectric cap 350 includes tetraethosiloxane (TEOS) silicon oxide, silicon oxynitride, nitrogen free anti-reflection layer (NFARL), or combinations thereof. Metal cap 352 includes tungsten dope carbon , WN, or combinations thereof. A first etching process is performed to transfer a pattern defined in the patterned resist layer (not shown) to metal cap 352 as shown in FIG. 8. A second etching process is performed on dielectric cap 350, the dielectric layer 348, and insert layer 346 by using metal cap 352 as an etch hard mask and CESL 344 as an etch stop layer, so as to form opening 353' exposing CESL 344 as shown in FIG. 9. A third etch process is performed by using metal cap 352 as an etch hard mask so as to remove portions of CESL 344 to extend opening 353', thereby forming trench opening 353 exposing dielectric layer 330 and via 342 as shown in FIG. 10. On some embodiments, the first, second and third etch processes include dry etching processes, wet etching processes, other etching processes, or combinations thereof. In the depicted embodiment, the first and second etch processes are implemented by dry etch processes such as various selective etching processes, and the third etch processes may be implemented by a wet etching process.

In FIG. 8, in furtherance to the depicted embodiment, the first etching process is implemented by a selective etching processes that implements etchants including, for example, chlorine-containing gas or other suitable gases, or combinations thereof. In some implementations, the selective etching processes is performed at a temperature of about 30 degrees Celsius to about 80 degrees Celsius.

In FIG. 9, in furtherance to the depicted embodiment, the second etching process is implemented by another selective etching processes that implements an etchant including For example, etchants including argon-containing gas, helium-containing gas, hydrogen-containing gas (such as $H_2$ and $CH_4$), nitrogen-containing gas (such as $N_2$), chlorine-containing gas, fluorine-containing gas (for example, $C_xH_yF_z$, such as $C_2H_2F_4$, and/or $C_xF_y$, such as $CF_4$, $C_2F_2$, $C_2F_4$, $C_3F_6$, $C_4F_6$, $C_4F_8$, $C_5F_8$, and $C_6F_6$), other suitable gases, or combinations thereof. In some implementations, another selective etching process is performed at a temperature of about 30 degrees Celsius to about 80 degrees Celsius. During the second etching process, dielectric layer 348 has an etching rate equal to or higher than insert layer 346. For example, an etch selectivity of dielectric layer 348 to insert layer 346 ranges from 1 to 7. Insert layer 346 has an etching rate march higher than CESL 344, therefore CESL 344 may be serve as an etching stop layer.

Figures 1, 9:
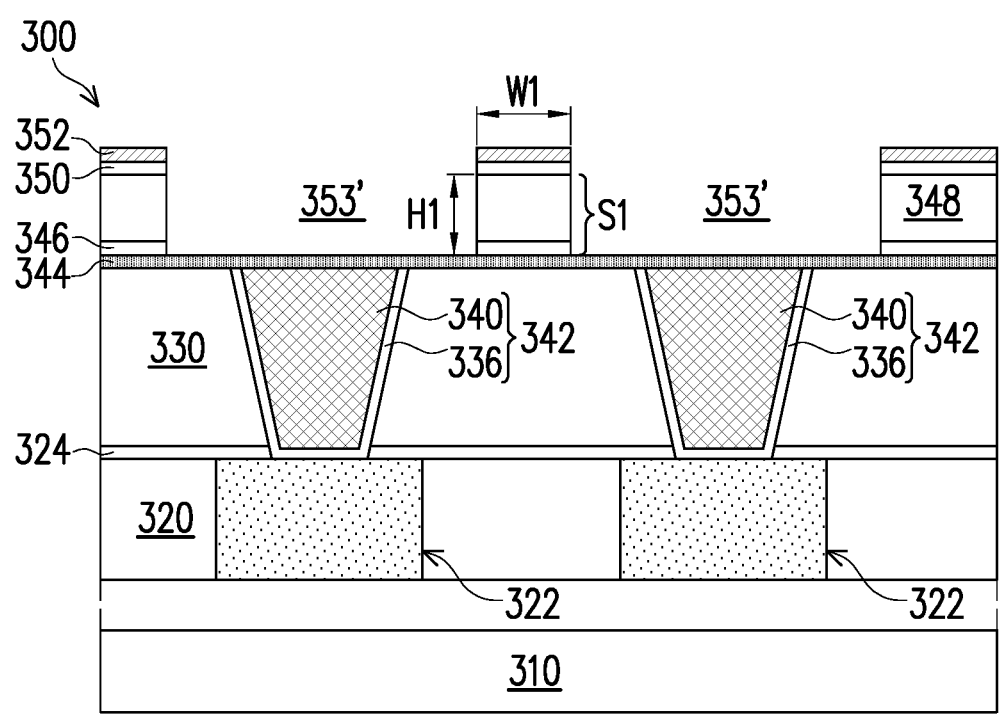

The second etching process also forms a stack S1 between two adjacent trench opening 353 as shown in FIG. 9-1. Stack S1 has a width W1 and a height H1. In some embodiments, the width W1 ranges from 8 angstroms to 15 angstroms, and the height H1 ranges from 20 angstroms to 65 angstroms. Stack S1 has an aspect ratio of height H1 to width W1 greater than 2. In some embodiments, the aspect ratio ranges from 2 to 8. Though stack S1 has a height aspect ratio, insert layer 346 is inserted below dielectric layer 348 may increase the structure strength of the dielectric layer 348. Therefore, addition of insert layer helps mitigate issues related to collapsing, and/or bending that may occur during the second etching processes.

In FIG. 10, in furtherance to the depicted embodiment, the third etching process is implemented by wet etching processes that implements an etchant including amine, saulfolane, dimethyl sulfoxide (DMSO), benzotriazole (BTA), $H_2O_2$, or combinations thereof. During the third etching process, CESL 344 has an etching rate equal to or higher than insert layer 346. For example, an etch selectivity of CESL 344 to insert layer 346 ranges from 1 to 5. In some embodiment, after the third etching process, an undercut is formed in CESL 344 under insert layer 346.

Figure 11:
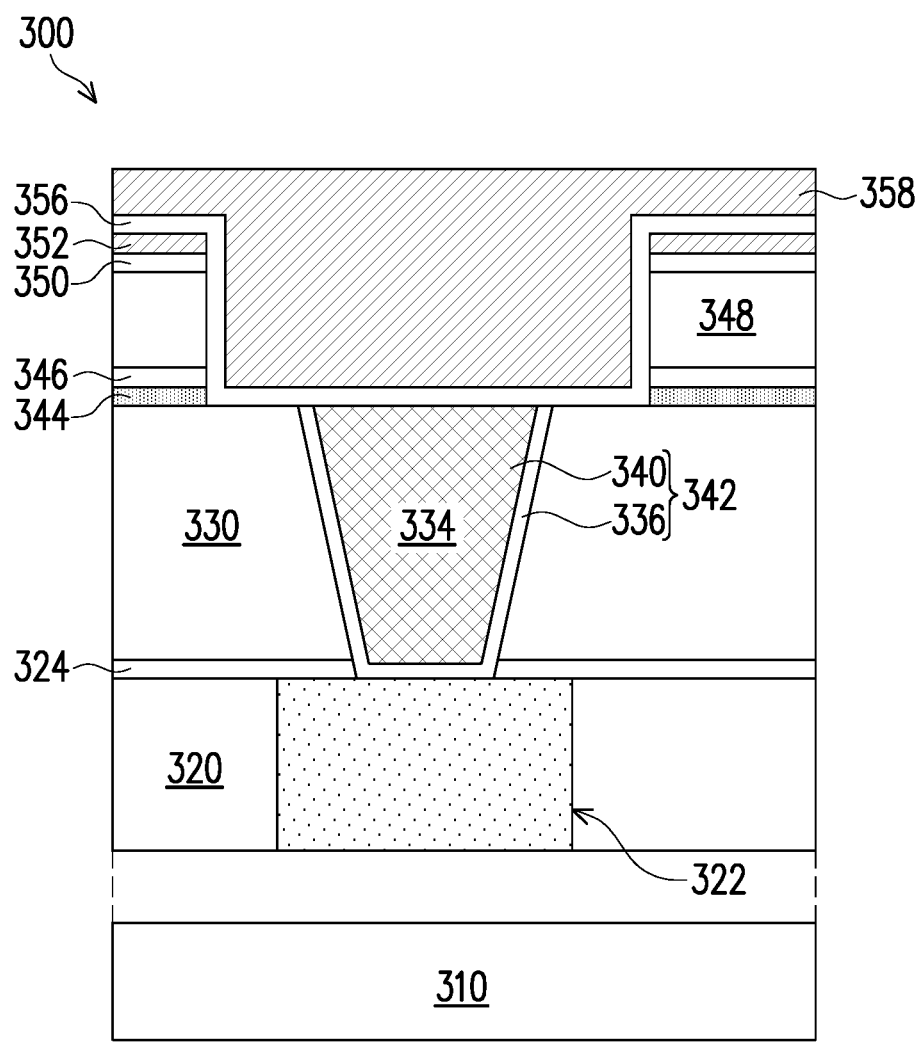

In FIG. 11, referring to block 236 of FIG. 3C, a barrier layer 356 formed in trench opening 353. Barrier layer 356 is similar to barrier layer 106 depicted and described in FIGS. 2A-2F. For example, barrier layer 356 includes TiN, TaN, WN, CoN, MnN, other suitable material, or combinations thereof. Barrier layer 356 is disposed along sidewall and bottom surfaces that define trench opening 353, such that barrier layer 356 partially fills trench opening 353. In the depicted embodiment, barrier layer 356 is disposed directly on top surface of metal cap 352, sidewalls of metal cap 352, dielectric cap 350, dielectric layer 348, insert layer 346 and CESL 344 that define trench opening 353, as well as over top surface of dielectric layer 330 and via 342. In furtherance of the depicted embodiment, barrier layer 356 is conformally deposited in trench opening 353, such that barrier layer 356 has a thickness that is substantially uniform over exposed surfaces of trench opening 353. Still further, the depicted embodiment provides that barrier layer 356 is formed by PVD, CVD, ALD, electroless plating, other suitable deposition process, or combinations thereof.

In FIG. 11, referring to block 238 of FIG. 3C, and further to the embodiment depicted in FIGS. 2A-2F, a conductive bulk layer 358 is forming in trench opening 353. Conductive bulk layer 358 is similar to conductive bulk layer 108 depicted and described in FIGS. 2A-2F. In the depicted embodiment, conductive bulk layer 358 includes a seed layer disposed below a fill layer. For example, conductive bulk layer 358 may include a copper-containing seed layer and a copper-containing fill layer disposed over the copper-containing seed layer. Conductive bulk layer 358 is formed over barrier layer 356, such that conductive bulk layer 358 fills any remaining space in trench opening 353. In the depicted embodiment, conductive bulk layer 358 is formed by PVD, CVD, ALD, electroplating, electroless plating, other suitable deposition process, or combinations thereof.

Figure 12:
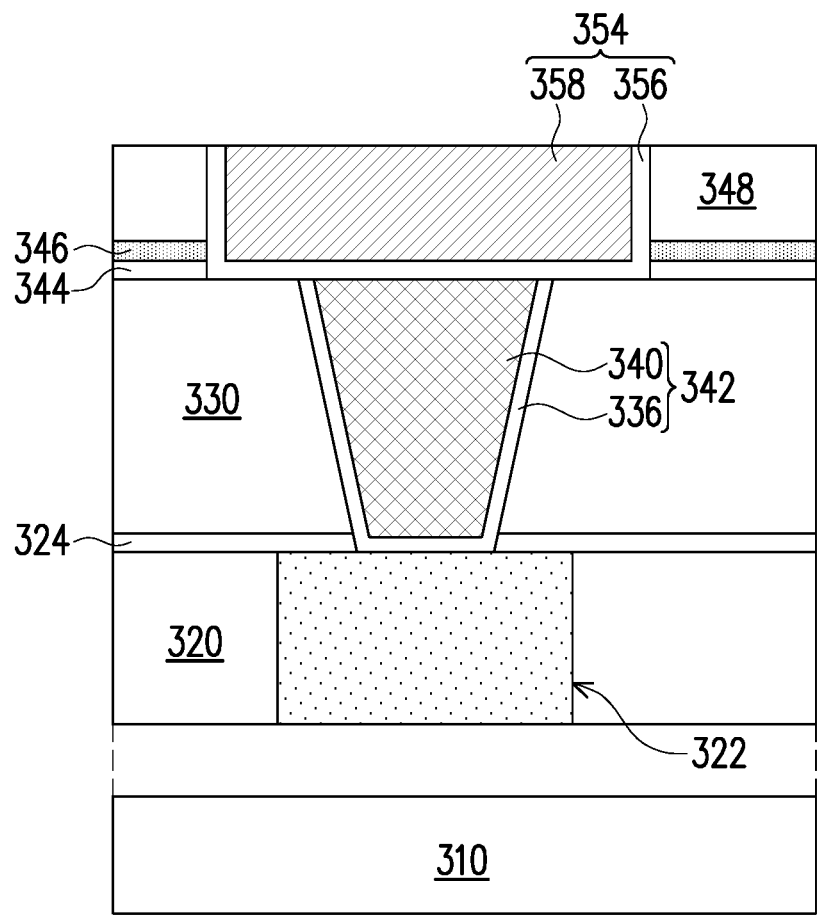

In FIG. 12, a CMP process and/or other planarization process is performed on interconnect structure 300. The CMP process removes excessive conductive bulk layer 358, barrier layer 356, metal cap 352, and/or dielectric cap 350, resulting in a conductive line 354 that includes barrier layer 356 and conductive bulk layer 358 (which together fill trench opening 353) is formed. In the depicted embodiment, the CMP process removes conductive bulk layer 358, barrier layer 356, metal cap 352, and/or dielectric cap 350 formed over a top surface of dielectric layer 348, such that a top surface of dielectric layer 348 and a top surface of conductive line 354 form a substantially planar surface.

Figure 13:
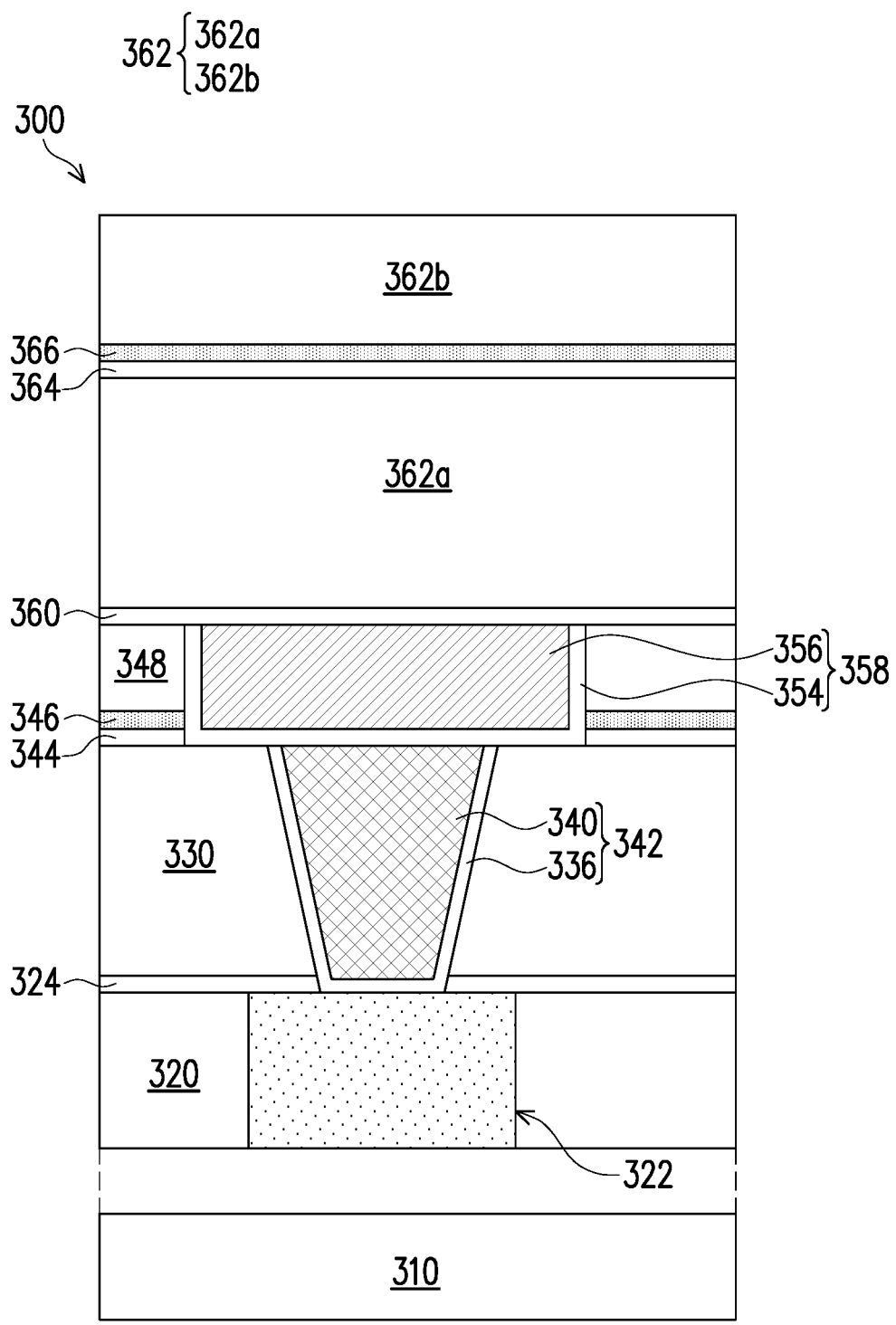

In FIG. 13, referring to block 242 of FIG. 3D, and further to the embodiment depicted in FIGS. 2E-2F, a dielectric layer 362 and an insert layer 366 is formed over conductive line 354 and dielectric layer 348. Dielectric layer 362 includes dielectric layer 362a and dielectric layer 362b. Dielectric layer 362a is formed over conductive line 354 and dielectric layer 348, insert layer 366 is formed over dielectric layer 362a, and dielectric layer 362b is formed over insert layer 366. Dielectric layer 362a and 362b are similar to IMD layers 48-50 depicted and described in FIGS. 1A-1F and FIGS. 2A-2F, and is formed by a deposition process, such as CVD such as PECVD, spin-on dielectric, other suitable processes, or combinations thereof. Insert layer 366 is similar to insert layers 55 and 155 depicted and described in FIGS. 1A-1F and FIGS. 2A-2F, and is formed by a deposition process, such as CVD such as PECVD, spin-on dielectric, other suitable processes, or combinations thereof. Insert layer 366 includes a material having a different etching characteristic than a material of dielectric layer 362, and the material contains silicon, oxygen, nitrogen or/and carbon (for example, silicon nitride, silicon oxynitride, silicon oxycarbide, or combinations thereof). In the depicted embodiment, the low-k dielectric material of dielectric layer 362 contains carbon of 5 at. % to 40 at. %, oxygen of 40 at. % to 55 at. %, and silicon of 30 at. % to 40 at. %, and CESL 59 include aluminum oxide, insert layer 366 contains carbon of 0 at. % to 20 at. %, oxygen of 20 at. % to 70 at. %, and silicon of 30 at. % to 60 at. %.

Figure 15:
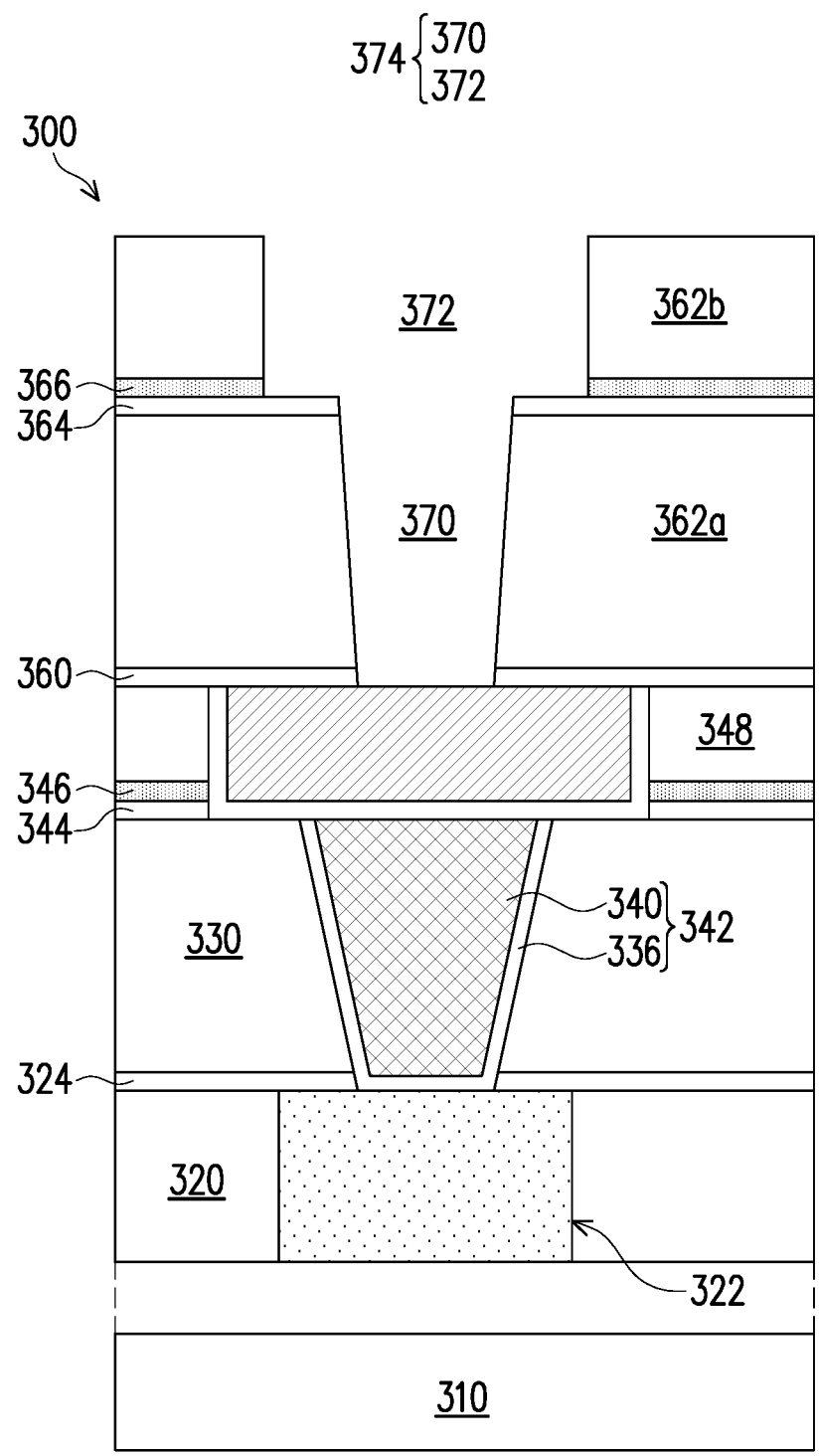
Figures 1, 15:
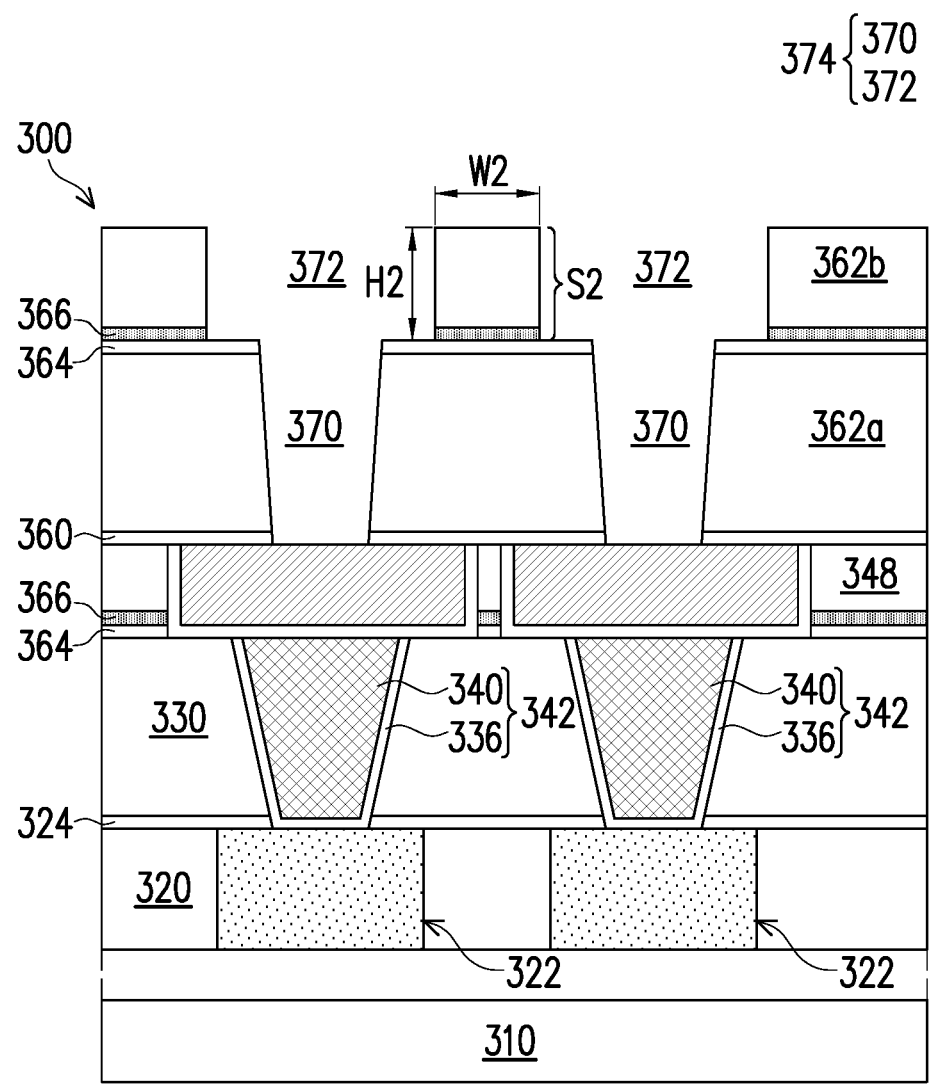

In FIG. 15, referring to block 244 of FIG. 3D, and further to the embodiment depicted in FIGS. 2E-2F, a dual damascene opening 374 is formed in dielectric layer 362 and insert layer 366 (and, in some implementations, CESL 360, and/or CESL 364) by a patterning process. Dual damascene opening 374 includes a via opening 370 and a trench opening 372 in spatial communication with via opening 370. In the depicted embodiment, via opening 370 extends through CESL 364, dielectric layer 362a, and CESL 360. Via opening 334 has sidewalls defined by dielectric layer 362a (and CESL 364 and/or CESL 360) and a bottom surface defined by conductive line 354. Trench opening 372 extends through dielectric layer 362b and insert layer 366. Trench opening 372 has sidewalls defined by dielectric layer dielectric layer 362b and insert layer 366 and a bottom surface defined by CESL 364.

Figure 14:
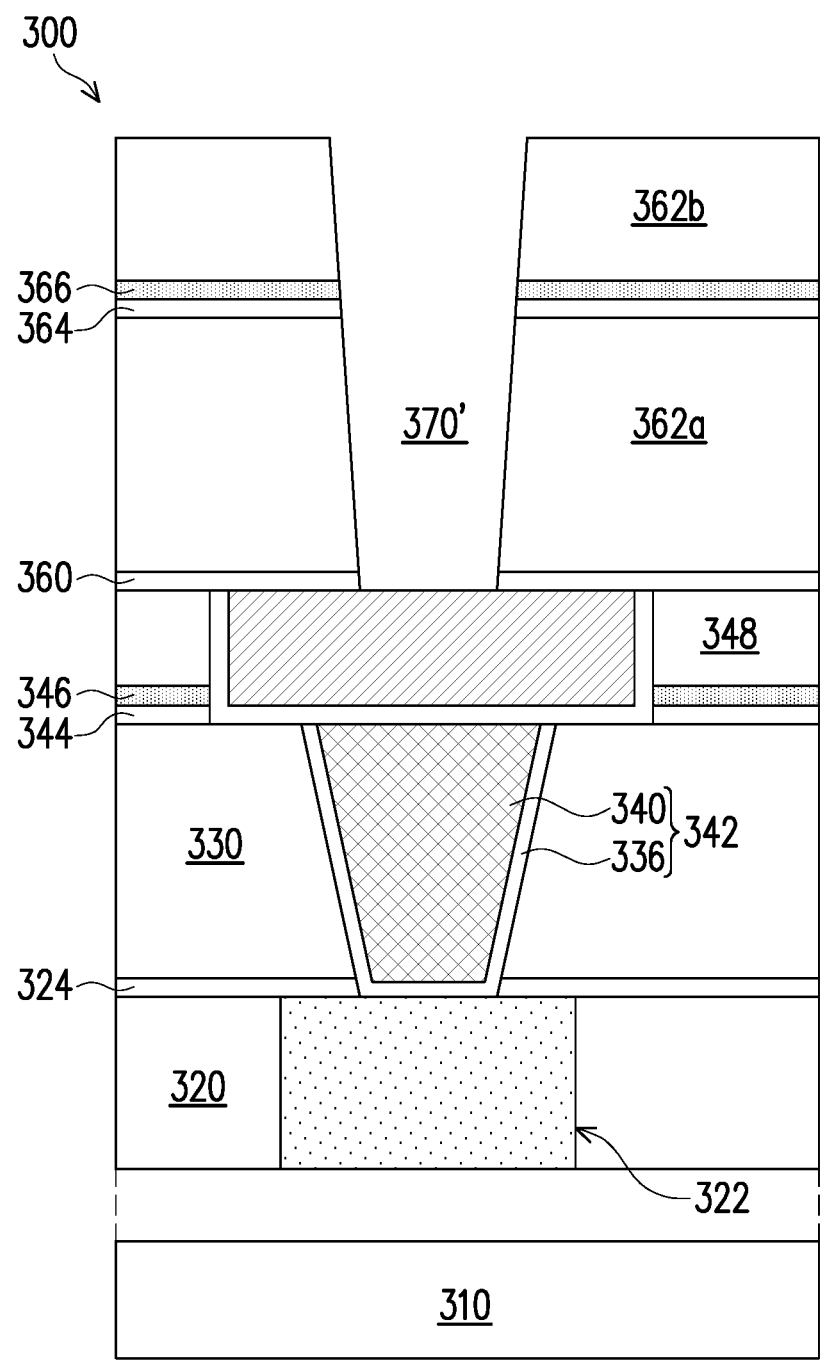

The patterning process includes lithography processes and/or etching processes. For example, forming dual damascene opening 374 includes performing a first patterning process and a second patterning process. The firs patterning process includes performing a lithography process to form a patterned resist layer over dielectric layer 362b and performing an etching process to transfer a pattern defined in the patterned resist layer to dielectric layer 362b, insert layer 366, and dielectric layer 362a (and CESL 364 and/or CESL 360) so as to form a vis opening 370' as shown in FIG. 14. The second patterning process includes performing another lithography process to form a patterned resist layer over dielectric layer 362b and performing another etching process to transfer a pattern defined in the patterned resist layer to dielectric layer 362b and insert layer 366 (and CESL 364 and/or CESL 360) so as to form a trench opening 372 in spatial communication with via opening 370 extends through dielectric layer 362a (and CESL 364 and/or CESL 360) as shown in FIG. 15.

In some embodiments, another etching process also forms a stack S2 between two adjacent trench opening 372 as shown in FIG. 15-1. Stack S2 has a height H2 and a width W2. In some embodiments, the width W2 ranges from 8 angstroms to 18 angstroms, and the height H2 ranges from 20 angstroms to 50 angstroms. Stack S2 has an aspect ratio of height H2 to width W2 greater than 2. In some embodiments, the aspect ratio ranges from 2 to 6. Though stack S2 has a height aspect ratio, insert layer 366 is inserted below dielectric layer 362b may increase the structure strength of the dielectric layer 362b. Therefore, addition of insert layer helps mitigate issues related to collapsing, and/or bending that may occur during the second etching processes.

Figure 16:
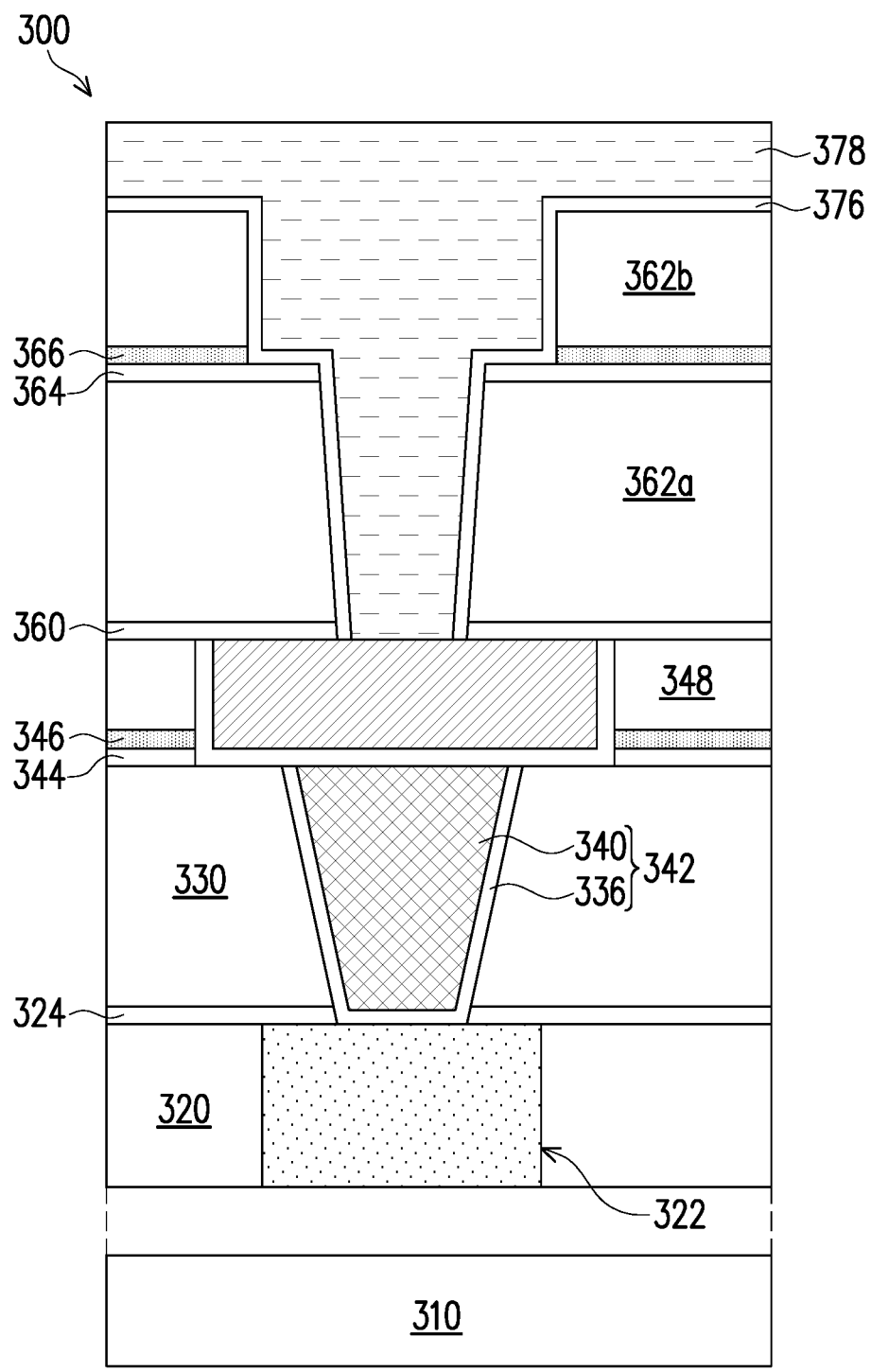

In FIG. 16, referring to block 246 of FIG. 3D, a barrier layer 376 formed in dual damascene opening 374. Barrier layer 376 is similar to via barrier layer 102 depicted and described in FIGS. 2A-2F. Barrier layer 376 is similar to barrier layer 106 depicted and described in FIGS. 2A-2C. For example, barrier layer 376 includes TiN, TaN, WN, CoN, MnN, other suitable material, or combinations thereof. Barrier layer 376 is disposed along sidewall and bottom surfaces that define dual damascene opening 374, such that barrier layer 376 partially fills dual damascene opening 374. In some embodiment, barrier layer 376 is conformally deposited in dual damascene opening 374, such that barrier layer 376 has a thickness that is substantially uniform over exposed surfaces of dual damascene opening 374. Still further, the depicted embodiment provides that barrier layer 356 is formed by PVD, CVD, ALD, electroless plating, other suitable deposition process, or combinations thereof.

In FIG. 16, referring to block 248 of FIG. 3D, and further to the embodiment depicted in FIGS. 2A-2F, a conductive bulk layer 378 is forming in dual damascene opening 374. Conductive bulk layer 378 is similar to conductive bulk layer 108 depicted and described in FIGS. 2A-2F. In some embodiments, conductive bulk layer 378 is a copper-containing layer. In the depicted embodiment, conductive bulk layer 378 includes a seed layer disposed below a fill layer. For example, conductive bulk layer 378 may include a copper-containing seed layer and a copper-containing fill layer disposed over the copper-containing seed layer. Conductive bulk layer 378 is formed over barrier layer 376, such that conductive bulk layer 378 fills any remaining space in dual damascene opening 374. In the depicted embodiment, conductive bulk layer 378 is formed by PVD, CVD, ALD, electroplating, electroless plating, other suitable deposition process, or combinations thereof.

Figure 17:
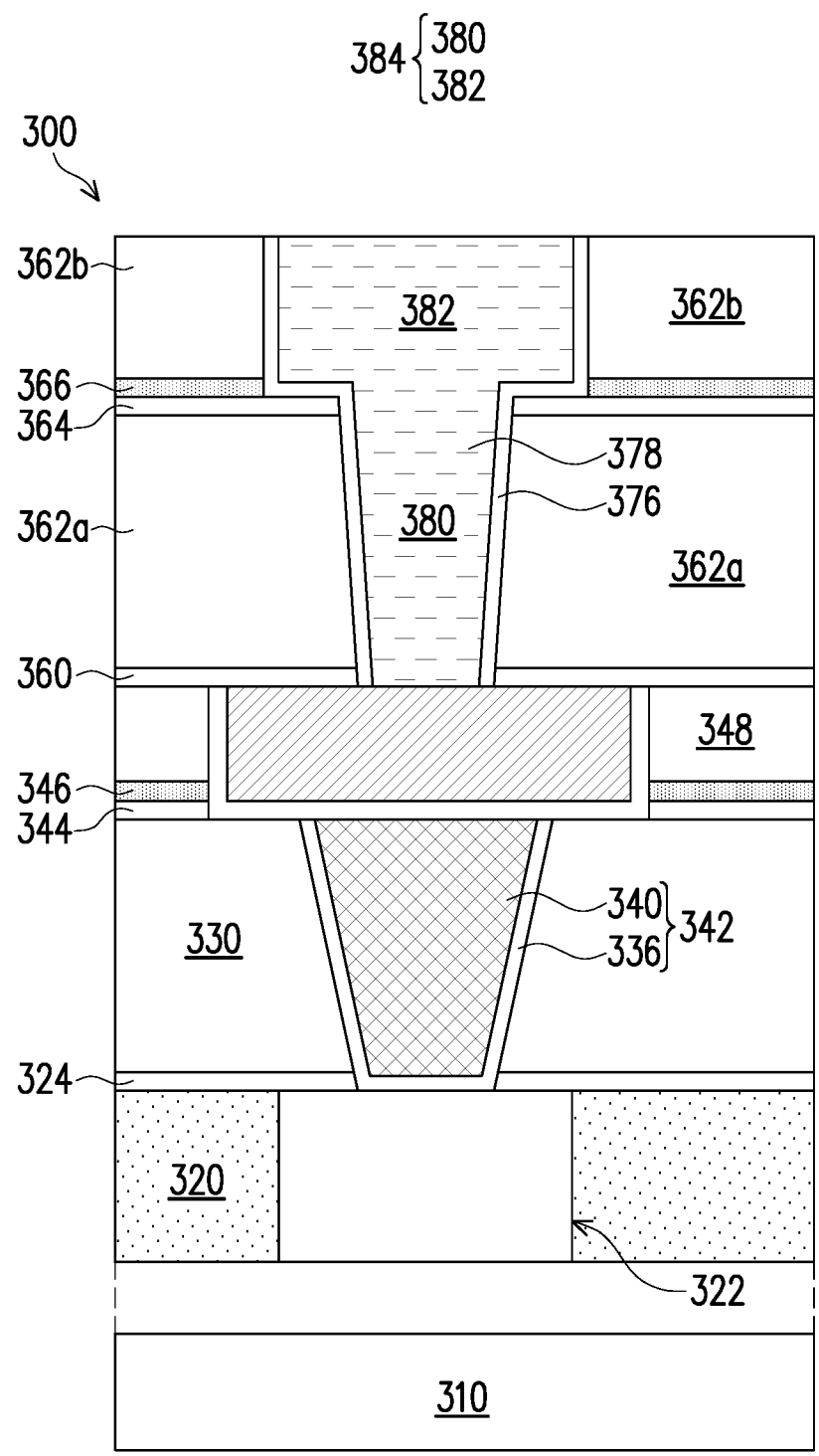

In FIG. 17, a CMP process and/or other planarization process is performed on interconnect structure 300. The CMP process removes excessive conductive bulk layer 378, barrier layer 376, resulting in a dual damascene 384 is formed, and a top surface of dielectric layer 362b and a top surface of dual damascene 384 form a substantially planar surface. The dual damascene 384 that includes via 380 and a conductive line 382 on the via 380. Barrier layer 376 and conductive bulk layer 378 filling in the via opening 370 forms via 380, while barrier layer 376 and conductive bulk layer 378 filling in the trench opening 372 forms conductive line 382.

In the depicted embodiment, after dual damascene 384 is formed, a dielectric layer is formed over dual damascene 384 and dielectric layer 362b. In many implementations, dielectric layer is configured to facilitate additional processing steps to fabricate interconnect structure 300. For example, fabrication of interconnect structure 300 may continue with forming a dual damascene or via, where the dual damascene physically and/or electrically couples dual damascene 384 to a conductive feature subsequently formed over the dual damascene 384. For example, the dual damascene or via is similar to dual damascene 384 or via 342 depicted and described in FIGS. 1A-1F and FIGS. 2A-2F. The dual damascene or via may be formed in dielectric layer disposed over dual damascene 384 by implementing the lithography, etching, and/or deposition processes described herein with reference to method 280 as depicted in FIG. 11-17 or 4-8.

In the present disclosure, an insert layer is included in the interconnect structure. The addition of insert layer helps mitigate issues related to collapsing, and/or bending that may occur during the patterning processes. In some embodiments, the bending is improved at least 40%. Additionally, by inserting insert layer, a capacitance of IC device may be reduced, leading to reduction in the overall RC delay of the IC device.

In some embodiment of the present disclosure, an interconnect structure includes an etching stop layer; a dielectric layer and an insert layer on the etching stop layer; and a conductive feature in the dielectric layer, the insert layer and the etching stop layer. A material of the insert layer is different from the dielectric layer and the etching stop layer.

In another embodiment of the present disclosure, an interconnect structure includes a first dielectric layer; an etching stop layer on the first dielectric layer; a second dielectric layer on the etching stop layer; an insert layer between the etching stop layer and the second dielectric layer; and a conductive feature in the second dielectric layer, the insert layer, the etching stop layer, and the first dielectric layer. A material of the insert layer is different from the first dielectric layer, the second dielectric layer, and the etching stop layer.

In yet another embodiment of the present disclosure, a method of forming an interconnect structure includes forming an etching stop layer; forming an insert layer on the etching stop layer; forming a dielectric layer on the insert layer; patterning the dielectric layer, the insert layer and the etching stop layer to form a plurality of trench openings; and forming a plurality of conductive lines in the plurality of trench openings. The patterning includes performing a first etching process on the dielectric layer and the insert layer to form a plurality of first openings exposing the etching stop layer; and performing a second etching process to remove the etching stop layer exposed by the first openings to form the plurality of trench openings.

The foregoing outlines features of several embodiments so that those skilled in the art may better understand the embodiment of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
   a first etching stop layer;
   a first dielectric layer on the first etching stop layer;
   a second etching stop layer on the first dielectric layer;
   a second dielectric layer and an insert layer on the second etching stop layer, wherein the inset layer is disposed between the second etching stop layer and the second dielectric layer; and
   a conductive feature in the second dielectric layer, the insert layer, the second etching stop layer, the first dielectric layer and the first etching stop layer, wherein the conductive feature comprises a conductive line in the second dielectric layer and the insert layer, and a via in the first etching stop layer and the first dielectric layer;
   wherein a material of the insert layer is different from the second dielectric layer and the second etching stop layer.

2. The interconnect structure of claim 1, wherein the insert layer has a Young's modulus greater than a Young's modulus of the second dielectric layer.

3. The interconnect structure of claim 1, wherein the insert layer has a dielectric constant less than a dielectric constant of the second etching stop layer.

4. The interconnect structure of claim 1, wherein the insert layer and the second dielectric layer contain silicon atom, and the second etching stop layer is free of silicon atom.

5. The interconnect structure of claim 1, wherein the conductive line is further disposed in and penetrates through the second etching stop layer.

6. The interconnect structure of claim 1, wherein the conductive feature comprises a plurality of conductive lines, the second dielectric layer and the insert layer between two adjacent conductive lines forms a stack, and the stack has an aspect ratio greater than 2.

7. The interconnect structure of claim 1, wherein the insert layer is in contact with the second etching stop layer.

8. The interconnect structure of claim 1, wherein the insert layer is embedded in the second dielectric layer.

9. The interconnect structure of claim 1, wherein the second dielectric layer comprises a first portion sandwiched between the insert layer and the second etching stop layer, and a second portion overlying the insert layer.

10. An interconnect structure, comprising:
    a first dielectric layer;
    an etching stop layer on the first dielectric layer;
    a second dielectric layer on the etching stop layer;
    an insert layer between the etching stop layer and the second dielectric layer; and
    a conductive feature in the second dielectric layer, the insert layer, the etching stop layer, and the first dielectric layer, wherein the conductive feature comprises a conductive line in the second dielectric layer and the insert layer, and a via in the first dielectric layer;
    wherein a material of the insert layer is different from the first dielectric layer, the second dielectric layer, and the etching stop layer.

11. The interconnect structure of claim 10, wherein the insert layer has a Young's modulus greater than a Young's modulus of the second dielectric layer.

12. The interconnect structure of claim 10, wherein the insert layer has a dielectric constant less than a dielectric constant of the etching stop layer.

13. The interconnect structure of claim 10, wherein the insert layer comprises silicon nitride, silicon oxynitride, silicon oxycarbide, or combinations thereof, and the etching stop layer comprises aluminum oxide.

14. The interconnect structure of claim 10, wherein the conductive feature comprises a dual damascene, and the dual damascene comprises the conductive line and the via, and the via is further disposed in the etching stop layer.

15. A method of forming an interconnect structure, comprising:
- forming a first dielectric layer;
- forming an etching stop layer on the first dielectric layer;
- forming an insert layer on the etching stop layer;
- forming a second dielectric layer on the insert layer and the etching stop layer, wherein the insert layer is between the etching stop layer and the second dielectric layer, and a material of the insert layer is different from the first dielectric layer, the second dielectric layer, and the etching stop layer; and
- forming a conductive feature in the second dielectric layer, the insert layer, the etching stop layer, and the first dielectric layer, wherein the conductive feature comprises a conductive line in the second dielectric layer and the insert layer, and a via in the first dielectric layer; wherein forming the conductive feature comprises patterning the second dielectric layer, the insert layer and the etching stop layer to form a plurality of trench openings, comprising:
  - performing a first etching process on the second dielectric layer and the insert layer to form a plurality of first openings exposing the etching stop layer; and
  - performing a second etching process to remove the etching stop layer exposed by the first openings to form the plurality of trench openings; and
  - forming a plurality of conductive lines in the plurality of trench openings.

16. The method of claim 15, wherein the insert layer has a Young's modulus greater than a Young's modulus of the second dielectric layer.

17. The method of claim 15, wherein the insert layer has a dielectric constant less than a dielectric constant of the etching stop layer.

18. The method of claim 15, wherein the insert layer comprises silicon nitride, silicon oxynitride, silicon oxycarbide, or combinations thereof, and the etching stop layer comprises aluminum oxide.

19. The method of claim 15, wherein the performing the first etching process comprises forming a stack comprising the second dielectric layer and the insert layer between two adjacent trench openings, and the stack has an aspect ratio greater than 2.

20. The method of claim 18, wherein the performing the first etching process comprises performing a dry etching process using an etchant having an etching selectivity of the second dielectric layer to the insert layer ranging from 1 to 5.

* * * * *